(12) United States Patent
Griffin

(10) Patent No.: US 12,068,573 B2
(45) Date of Patent: Aug. 20, 2024

(54) LASER-TO-OPTICAL-FIBER CONNECTION

(71) Applicant: Cyclone Biosciences, LLC, Phoenix, AZ (US)

(72) Inventor: Stephen E. Griffin, Peoria, AZ (US)

(73) Assignee: CYCLONE BIOSCIENCES, LLC, Phoenix, AZ (US)

( * ) Notice: Subject to any disclaimer, the term of this patent is extended or adjusted under 35 U.S.C. 154(b) by 0 days.

(21) Appl. No.: 17/994,517

(22) Filed: Nov. 28, 2022

(65) Prior Publication Data

US 2023/0088368 A1 Mar. 23, 2023

Related U.S. Application Data

(63) Continuation-in-part of application No. 17/847,608, filed on Jun. 23, 2022.

(60) Provisional application No. 63/225,812, filed on Jul. 26, 2021.

(51) Int. Cl.
| | |
|---|---|
| G02B 6/02 | (2006.01) |
| G02B 6/293 | (2006.01) |
| H01S 5/02251 | (2021.01) |
| H01S 5/02257 | (2021.01) |

(52) U.S. Cl.
CPC ........ H01S 5/02251 (2021.01); G02B 6/2938 (2013.01); H01S 5/02257 (2021.01)

(58) Field of Classification Search
CPC ..................................................... G02B 6/29
USPC ......................................................... 385/14
See application file for complete search history.

(56) References Cited

U.S. PATENT DOCUMENTS

| | | | |
|---|---|---|---|
| 6,788,864 B2* | 9/2004 | Ahmad | G02B 6/02304 385/123 |
| 8,622,625 B2* | 1/2014 | Benjamin | G02B 6/25 385/72 |
| 10,082,630 B1* | 9/2018 | Hsia | G02B 6/14 |
| 2003/0021301 A1* | 1/2003 | Vahala | H01S 3/30 372/3 |
| 2006/0072875 A1* | 4/2006 | Bhagavatula | G02B 6/29332 385/30 |

(Continued)

FOREIGN PATENT DOCUMENTS

| | | |
|---|---|---|
| CA | 2248912 A1 * | 9/1997 |
| JP | H07311323 A * | 11/1995 |

(Continued)

*Primary Examiner* — Kaveh C Kianni
(74) *Attorney, Agent, or Firm* — Quarles & Brady LLP; Yakov S. Sidorin

(57) ABSTRACT

An article of manufacture including a fiber optic termination of a small core optical fiber for use with a surgical laser apparatus (the output from which may be characterized by a high $M^2$ factor) or other high-power or high-energy laser (including an appropriate fiber laser) is configured for safe and efficient coupling of light at a large laser focal point and/or to enable the process of coupling of radiant intensities exceeding the silica fiber damage thresholds and/or those ionizing the air if fully focused therein. The termination may include a glass cylinder structured to include a core region and a glass cladding region the ratio of dimensions of which is substantially equal to the ratio of respectively-corresponding dimensions of the employed optical fiber. A method of propagating light through such article of manufacture.

24 Claims, 11 Drawing Sheets

DETAIL A

(56) References Cited

U.S. PATENT DOCUMENTS

| | | | | |
|---|---|---|---|---|
| 2009/0304551 A1* | 12/2009 | Mutharasan | G01N 21/7703 | 422/82.11 |
| 2010/0247047 A1* | 9/2010 | Filippov | C03B 37/02763 | 385/127 |
| 2012/0127563 A1* | 5/2012 | Farmer | G02B 6/14 | 359/341.3 |
| 2012/0219026 A1* | 8/2012 | Saracco | G02B 6/14 | 372/21 |
| 2012/0262781 A1* | 10/2012 | Price | H01S 3/06754 | 359/341.3 |
| 2013/0011102 A1* | 1/2013 | Rinzler | G02B 6/262 | 385/94 |
| 2013/0236153 A1* | 9/2013 | Rochette | C03B 37/15 | 83/13 |
| 2016/0327748 A1* | 11/2016 | Stern | G02B 6/305 | |
| 2018/0045895 A1* | 2/2018 | Lee | G02B 6/14 | |
| 2018/0067259 A1* | 3/2018 | Teng | G02B 6/30 | |
| 2018/0120504 A1* | 5/2018 | Qi | G02B 6/3636 | |
| 2019/0265416 A1* | 8/2019 | Otfried Brusberg | G02B 6/12016 | |
| 2022/0229225 A1* | 7/2022 | Guan | G02B 6/02076 | |
| 2023/0098658 A1* | 3/2023 | Watté | G02B 6/305 | 385/33 |

FOREIGN PATENT DOCUMENTS

| | | | | |
|---|---|---|---|---|
| JP | 3267992 B2 * | 3/2002 | | B82Y 15/00 |
| WO | WO-02084362 A1 * | 10/2002 | | B29D 11/00721 |

* cited by examiner

LASER-TO-OPTICAL-FIBER CONNECTION

CROSS-REFERENCE TO RELATED APPLICATIONS

This US Patent Application is a continuation-in-part from the U.S. patent application Ser. No. 17/847,608 filed on Jun. 23, 2022, which in turn claims priority from and benefit of the U.S. Provisional Patent Application No. 63/225,812 filed on Jul. 26, 2021. The disclosure of each of the above-identified applications is incorporated by reference herein.

TECHNICAL FIELD

This invention relates to fiber-optic termination arrangements configured to radiatively couple optical waveguides such as optical fibers and sources of laser radiation—for example, surgical lasers (e.g., holmium lasers, CTH:YAG, and Ho:YAG lasers, for example) and/or other laser sources generating low-$M^2$ (low beam quality factor) laser output such as to efficiently couple such low-quality but high intensity radiant output into the optical fibers and/or fiber lasers and/or fiber amplifiers. The discussed terminations may at least in some circumstances facilitate coupling of high-energy laser pulses to optical fibers with such core diameters that otherwise require exceeding the breakdown threshold level for ambient air or the damage threshold of the fiber-optical surface (in which case, the use of the embodiments of the invention avoids and/or prevent such breakdown) and/or simplify the process of fabrication substantially eliminate the need in mutual alignment/orientation of constituent component to produce compact integrated optical arrangements that are substantially not subject to breakage during intended use.

RELATED ART

Holmium lasers primarily find application in urology and, specifically, for vaporization and enucleation of hyperplastic prostate tissue (BPH) and breaking apart kidney stones (although additional applications exist for both soft and hard tissue targets). These infrared lasers typically produce 0.2 Joule to 6 Joule pulses with 350 μs to 1200 μs pulse width at rates from about 5 pulses per second (pps) to about 120 pps at wavelengths ranging from about 2.08 μm to about 2.14 μm, with average powers ranging from about 8 W to about 140 W.

A skilled person understands that light outputs generated by holmium lasers are spatially multimode and of particularly low quality, which is reflected in a low $M^2$ factor or parameter. (The $M^2$ factor of a laser beam also referred to as a beam quality factor or beam propagation factor, is a common measure of the beam quality of a laser beam and is known in related art to represent the degree to which the light beam can be focused for a given beam divergence angle. A diffraction-limited beam such as a Gaussian beam, for example, has an $M^2$ factor of 1. A typical value of $M^2$ for a surgical laser such as a holmium laser is at least several tens, sometimes less than 50, but when such laser is overheated—which is a common occurrence—the $M^2$ value can reach triple digits: thermally-induced refractive index gradients and birefringence in holmium laser rods distort the laser output, both beam diameter and divergence drift during use/operation of a given laser, and myriad spatial modes are generated.) Higher-power holmium lasers employ two or more laser heads the outputs from which are combined to produce the total laser output, which further reduces the beam quality.

Furthermore, surgical lasers are routinely repositioned and subjected to jolts and bumps in hospital corridors, freight elevators, thresholds, etc., which detrimentally affects the degree of adjustment of constituent parts of the lasers: this leads to the need to keep the corresponding focusing optics as robust and simple as possible. Structurally simple optics, used in combination with poor quality laser power output, produce focal spots that are atypically large, misshapen, unstable, and vary widely in parameters not only from manufacturer to manufacturer but even throughout a given laser's lifetime and even within a single surgical session. (Indeed, nominal laser focal spot diameters are often defined at a $1/e^2$-level of maximum of a semi-Gaussian irradiance profile, such that about 14% of the laser output energy lies outside of the nominal spot diameter. Pulses produced at the beginning of a given session—that is, from cold laser media—typically have higher energy than subsequent pulses, but as the laser medium heats with use the pulse foci balloon and may drift.)

High-energy infrared laser pulses vaporize most of the materials (from polymers to metals) that are used in producing fiber-optic coupling structures devised to have such light pulses coupled to the optical fibers. Optical fiber terminations that are coupled to holmium lasers are routinely damaged by misalignment between the fiber core and the laser. Once damaged, such fiber couplings may in turn case damage to the laser optics. For example, lenses or "blast shields" (protective AR-coated windows often used with the holmium lasers) are pitted or coated with organic and inorganic debris, thereby further reducing the operational performance, whether subtly or dramatically. Subtle damage routinely goes unrecognized until accumulation of such damage with time results in catastrophic failure of the laser optics (such as blast shields, lens, mirrors, rods) or the optical fibers themselves, at the point of interconnection between a laser source and the fiber (that is, at the optical fiber termination) or even meters away (for example, at a location within the patient).

Designs of optical fiber termination structures or couplings (interchangeably referred to herein as OF terminations or fiber terminations) known from related art are directed to surviving a significant fiber core overfill when a corresponding optical fiber is coupled to the laser source (and include, for example, the contraptions in which the overfill energy is spatially filtered and typically reflected, scattered or absorbed). Some related-art implementations seek to capture at least some of the fiber core overfill energy within the fiber core with the use of tapered input sections (where the fiber core is larger at the input face of the optical fiber unit) and others claim to reduce or eliminate light coupling to the cladding, to the exclusion of or in addition to the core.

Related art often fails to consider the problems associated with the relatively high attenuation of light at a wavelength of about 2,100 nm in silica-silica optical fibers (which attenuation is highly dependent upon the interactions of evanescent optical field with the optical fiber cladding(s), while such interactions, in turn, are dependent upon the angular spectrum of the spatial mode population within the fiber). Typical silica-silica optical fiber attenuation ranges from about 1% to about 3% per meter of fiber length for core modes, while cladding modes are attenuated at roughly 10% to 15% per meter (which largely depends upon the refractive index, thickness, and transparency at 2,100 nm of polymers used as "secondary cladding" materials). Much of the energy that is lost to attenuation leaks from the fiber, into the polymer cladding and protective jacket. Fibers fail catastrophically when this leaked energy has radiant intensity sufficient to melt or burn the polymer layers surrounding the silica-silica fiber: a phenomenon that is referred to in the laser surgery field as a "burn through".

A skilled artisan should be additionally aware of losses caused by microbending due to defects at the silica-core-to-silica-cladding interface are introduced during fiber preform production. Additionally, loss-causing microbending is created by defects at the silica-cladding-to-polymer-cladding interface, by stresses induced by the jacketing (typically EFTE) shrinkage during extrusion, by fiber-jacket-to-secondary-clad bonding, and by dimensional variations in the core that are introduced during fiber draw. While a surgical-laser-fiber designer may be able to control, at least to some degree, contributions to transmission losses (for example, by selecting the best base fiber material to work with, establishing strict dimensional limits for core and claddings, and/or selecting among available polymer claddings), in the case of smaller and more flexible surgical laser fibers, insufficient cladding thickness continues to be a significant source of attenuation due to surgical access constraints imposed on overall diameter and stiffness of such fibers.

Fiber cladding modes suffer greater attenuation than low-order core modes and predispose a laser fiber to burn through failure. In striving to produce fiber terminations that survive spatial overfill of the fiber core, most recent holmium laser fiber designs introduce new sources of cladding mode excitation. To this end, FIG. 1 illustrates two causes of cladding mode excitation in holmium laser fibers resulting from fiber termination defects. FIG. 1A depicts a fiber 105 where the fiber axis 110 is tilted with respect to the axis 115 of the laser beam 125 (focused with the lens 120) such that the fiber acceptance cone α is misaligned with the laser focus cone θ. FIG. 1B depicts an optical fiber 145 with a fiber face or facet 130 polished at an angle such that the fiber facet plane 135 is not orthogonal to the converging laser beam axis 115. (Note, that the axis 110 of the fiber and the axis 115 of the laser beam are substantially coincident.) As a result, the acceptance cone α of the fiber 145 is misaligned with respect to the cone θ of the focused laser beam. A skilled person will readily appreciate that additional alignment errors are also practically inevitable in surgical laser fiber terminations due to eccentricities of fibers within the laser connectors (typically SMA 905) and pitch within the connector bore.

Some excitation of cladding modes (that is due to or caused by the laser performance or damaged optics) can only been mitigated by an appropriate design of a fiber termination. This is the case, for example, of what is known in the art as beam blooming, which generally increases the fill factor of optical located down the beam (considered now in reference to FIG. 2). In current context, the effect of beam blooming is generally the result of thermal gradients within the laser due to internal heat dissipation limitations, but some prior art fiber terminations amplify this problem by reflecting a portion of the laser energy back into the laser cavity, further destabilizing the laser medium or even pitting the rod face. FIG. 2A depicts a nominal holmium laser focus where the lens 50 is selected to focus a nominal output 75 of the laser rod at the focal plane 55 such that the focal spot diameter 60 is smaller than the core 65 of the fiber 70 and the focal cone angle θ is lower than the minimum acceptance cone α of the fiber 70. When holmium laser rods heat unevenly, the refractive index of the rod changes non-uniformly, producing a variable, and typically larger, diameter beam. FIG. 2B depicts the laser focus of FIG. 2A where the output 80 of the laser rod has "bloomed" (or increased in diameter from the value corresponding to the beam 75 of FIG. 2A to that corresponding to the larger beam 80) due to thermal lensing such that it fills more (a larger area) of the focusing lens 85, thereby causing the angle of convergence of the laser beam on the other side of the lens to increase from θ to $\theta_1 > \theta$, thereby overfilling the angle α of the fiber acceptance cone and causing the focal spot to increase in diameter (from 60 of FIG. 2A to 90).

Where the laser output blooms, the numerical aperture NA of the fiber meridional mode may be overfilled, as is schematically illustrated by FIG. 2B, but because the fiber core is chosen to be larger than the nominal diameter of the laser focal spot diameter, the fiber core is not spatially overfilled. In practice, unfortunately, the overfilling of the fiber acceptance angle goes unnoticed in most cases because the polymer coating over the fiber's glass cladding is able to weakly guide the angular overfill, but should such fiber be subjected to bending stress (e.g. by the surgeon's wrapping the fiber about his hand to gain a good grip; or by the fiber bending at the cystoscope working channel port, or just distal to the laser connection) higher-order spatial modes will be immediately transformed or converted to cladding modes that are poorly guided, thereby degrading the polymer cladding in a cascade of failure that typically ends catastrophically.

FIG. 3 illustrates the situation when a fiber 350, having a substantially constant core diameter and a polymer cladding 350A has characteristics that do not allow such fiber accept a ray of light 320 arriving adjacent to the input facet of the fiber at an angle of about 10° with respect to the fiber axis. To address this problem, the fiber 350 may be complemented with (for example, grown on or fused with) a down-tapered polymer-cladding-free input section 305 of the optical fiber into which the input laser light—schematically illustrated by a ray 320—is coupled, and mode conversion (mode promotion) that occurs inside the tapered fiber section 305 (illustrated here by neglecting refraction at the air-glass interface for simplicity of illustration).

Here, a higher-order focal mode of laser light 320 is shown to be coupled into the tapered fiber section 305 at an angle that is measured with respect to the axis 305A of the section 305 and that is below the maximum acceptance cone angle of the fiber (here, about 12.7°). The light 320 is reflected within the taper 305 at the core-cladding interface at a location 330 and are raised in angle of propagation, by the taper half angle, by 2.5° to 12.5° (that is, continues to propagate at a higher angle with respect to the axis 305A). When the so-promoted rays encounter the taper wall for a second time (see location 335), the rays are again promoted in angle by 2.5° at the core-cladding interface. The resulting angle of about 15° in this example exceeds that corresponding to the silica-silica numerical aperture value such that, on a subsequent encounter with the taper wall (at location 340) the rays pass through the core-cladding interface. These rays are again reflected, but by the glass-air interface of the polymer-cladding free taper 305, and are promoted to 17.5° and finally to 20° just prior to entering the cylindrical fiber 350.

Tapered input fibers—such as that depicted in FIG. 3—are disclosed, for example, in U.S. Pat. Nos. 6,282,346; 7,309, 167; and 7,699,535, all issued to Griffin. While such constructs are useful for coupling light from laser sources producing spatially-large output distribution of laser light to a small-core fiber, such coupling is accomplished with a concomitant cost of a reduced angular aperture. Here, where rays such as 320 would be guided by a fiber with a core diameter larger than that of the fiber 350 (assuming the base fiber has a NA 0.22 with an acceptance half angle of ~12.7° in air), when captured by the tapered input fiber section 305 the ray angle relative to the fiber longitudinal axis is increased by the fiber taper half angle at each encounter with the angled wall, in the case of FIGS. 3, to 12.5° at 330, 15° at 335, 17.5° at 340, and 20° at 345.

Notably, employing tapered fiber constructs of FIG. 3 in reverse will convert higher order modes to lower orders only when the taper axial alignment is assured, and taper angles are lower than the highest order modes excited within the fiber core.

The so "propagation-angle-promoted" rays such as ray 320 of FIG. 3 120 are problematic in that they render the distal fiber 350 susceptible to burn through (when bent; as disclosed for example by Griffin in U.S. Pat. Nos. 9,122,009 and 9,223,089. Specifically, when the un-tapered fiber 350 is coated with a low refractive index polymer (shown as layer 350A), these high-order modes of light propagating at about 20° with respect to the axis of the fiber 350 will be guided as cladding modes until light in these modes is lost to attenuation, exits the distal tip of the fiber 350, or contributes to a burn through failure. U.S. Pat. Nos. 9,122,009 and 9,223,089 provide a particular solution to this problem manifesting in partial collimation of the higher angle rays to avoid mode promotion in the fiber taper. Collimation is accomplished by equipping the tapered fiber input with a convex lens element formed on the fiber surface itself as shown in FIG. 4.

FIG. 4 illustrates an approach facilitating a compensation for this mode conversion process towards the higher-angle excited modes. Here, the same higher-order spatial mode 320 is coupled into the down-tapered (typically, linearly tapered) section 415 of optical fiber that exhibits a inwardly curved (convex) input surface or facet 455 forming, at the input 460 of the taper 415, a negative lens element refracting the input light 320 into the mode 430 propagating towards the regularly-dimensioned optical fiber 350 (which is merged with an output facet of the taper 415) such that the refracted mode 430 never encounters the taper wall 475, but instead reflects for the first time within the bounds of the fiber 350 at location 465. Using such a concave lens input, tapered input fiber section may perform as well as, or better than, many straight input fibers. However, even these types of OF terminations can contribute to excitation and conversion of cladding modes under more stressful conditions (such as, for example, beam blooming or scatter in damaged optics).

Other fiber termination strategies, e.g. that schematically depicted in FIG. 5, often also inadvertently result in launching cladding modes. U.S. Pat. No. 7,090,411 (to Brown) discloses a glass ferrule 535 surrounding a polymer denuded fiber 530 with unpolished (saw cut) glass faces 520 & 545 configured to act as light diffusers as well as internal multifaceted reflectors and reduced diameter input fibers. Such scattering elements, as exemplified by 520 and 545, scatter laser focal rays 510 with the bulk of the overfill energy being redirected toward polymer clad 550 and ETFE buffered 565 segments of the distal fiber such that very high order scattered modes may couple to the fiber core-cladding within the polymer-free segment proximal to 515 and become guided as cladding modes within the polymer clad fiber at 550.

The skilled artisan will also readily appreciate a related situation in which the optical coupling between a conventional fiber laser or fiber amplifier and a target optical waveguide (for example, an optical fiber) is, understandably, subject to the same deficiencies as those already outlined in reference to FIGS. 3, 4 when the conventional fiber tapers are used, and subject at least to complicated and involved mutual alignment when bulk coupling optics is used. In particular, fiber lasers currently used in related art (for example those employing a Tm-doped core gain medium and Ge-doped fiber regions carrying distributed Bragg gratings), likely because such lasers cannot have an output facet of the optical fiber coated with an antireflection coating, are juxtaposed with (directly attached to) a quartz cylinder (typically, of about 2 mm or so in diameter) that has its end AR-coated. However, such juxtaposition breads the very problem limiting the useful life span of the resulting device of the related art: any time one attempts a fusion between a small diameter part and a large diameter part—lack of co-axial cooperation and various angular errors are inherently present, thus necessarily resulting in lack of reproducibility during the process of manufacture. This problem has not been addressed thus far, to the best knowledge of the inventor.

Related art also presents a tapered fiber with a lens on the input surface (see lens surface 680, in FIG. 6 that represents a OF termination employing an accessory quartz ferrule 685 that is fused 690 about the taper 695 to produce a larger surface upon which to form a functional lens 680) are limited in function due to the sum of multiple variables such as the actual base fiber NA (typically +/−0.02), distance from on-fiber lens 680 to the bottom of the taper 675 (first distal point where the fiber core is unaltered), lens focal length, the linearity of the wall 695 of the taper 675. The uncertainties in these and other variables necessitate a focal length compromise that results in a less than optimum quasi-collimation in avoidance of overcorrection (where the beam waist occurs before the end of the taper such that an encounter with the taper wall is mode promoting).

Accordingly, there remains an unsatisfied industrial need in in fiber termination technologies avoiding or compensating for the above-discussed deficiencies.

SUMMARY

Embodiments of the invention include an optical fiber-based one-piece apparatus that includes an optical fiber termination component and that is configured to collect and spatially reshape light that has been transferred to the optical fiber termination from (and, optionally, generated within) the constituent optical fiber such as to directly couple this light to a target optical element (such as a surgical optical fiber system) without the conventional use of an additional lens. The apparatus is dimensioned to operate as an optical mode stripper in that it ensures the propagation of light from the constituent optical fiber through the optical fiber termination in one, single direction only while its operation is devoid of producing a reflection of light back to the constituent optical fiber. Understandably, the apparatus can be used in reverse to couple light from the target optical element into the optical termination without the use of an intermediate lens and to deliver such light into the constituent optical fiber. A method of using the apparatus optionally includes generation of light within the constituent optical fiber.

In particular, embodiments of the invention provide an article of manufacture that has an axis and that includes an optical fiber component (which contains a sequence of immediately-neighboring one another multiple dielectric boundaries defined across the axis), a substantially cylindrical body of glass with an output facet; and an intermediate body of glass material seamlessly connected with the optical fiber component at a first end thereof and seamlessly connected with the substantially cylindrical body of glass at a second end thereof. Here, the article is configured to propagate an optical mode of the optical fiber component through both the intermediate body and the substantially cylindrical body only in one direction. Optionally, such optical fiber component includes a first optical fiber element having a first glass content and carrying the multiple dielectric boundaries and a second optical fiber element made of substantially the same glass material as that of the intermediate tapered body, and/or an outer surface of the intermediate body is connected with an outer surface of the substantially cylindrical body in a tangentially parallel manner, and/or a diameter of the intermediate body is different from both a diameter of the optical fiber component and a diameter of the substantially cylindrical body. Alternatively or in addition, and substantially in every implementation of the article of manufacture, the intermediate body may be configured to have a first diameter thereof at the first end be smaller than a second diameter thereof at the second end while, at the same time, defining a first angle of divergence of an optical mode of the optical fiber component propagating therethrough at the first end to be larger than a second angle of divergence of such propagating optical mode at the second end. Alternatively or in addition, and substantially in every implementation, a combination of the intermediate body and the substantially cylindrical body may be configured such as to define a propagation of an optical mode of the optical fiber component between the first and the output facet to be without a reflection on a dielectric boundary; and/or the substantially cylindrical body of glass may be dimensioned such as to define a spatial expansion of the optical mode of the optical fiber component, that has reached the substantially cylindrical body of glass through the intermediate body, at a substantially constant rate while propagating therethrough; and/or the intermediate body may be dimensioned such as to change an angle of divergence of the optical mode of the optical fiber component, propagating therethrough from the optical fiber component to the substantially cylindrical body, at least once. (In at least one specific case, the intermediate body may be structured to include a sequence of multiple coaxially positioned truncated cones of glass material spatially coordinated with one another such that a top of a first truncated cone forms a part of a base of a second truncated cone.) Alternatively or in addition, and substantially in every embodiment, the optical fiber component may be configured to include two first optical fiber elements each having a first glass content and each carrying multiple dielectric boundaries defined across the axis, and a third optical fiber element between such two first optical fiber elements. (In one case, a glass content of the third optical fiber element can be made necessarily different from the first glass content; and/or the combination of the two first optical fiber elements and the third optical fiber element may be configured to increase an irradiance light, generated in such third optical fiber element when an auxiliary light is delivered to the third optical fiber element.) Alternatively or in addition, and substantially in every implementation of the article of manufacture, the optical fiber component has a fiber core and a fiber cladding, and the substantially cylindrical body may be configured to have a termination core, and a termination cladding while in at least one specific case of the latter a first ratio of the termination core diameter to the termination cladding diameter is maintained substantially equal to a second ratio of the fiber core diameter to the fiber cladding diameter. Optionally, the substantially cylindrical body may be dimensioned such that an optical mode of the optical fiber component propagating therethrough is not totally internally reflected at a boundary between the termination core and the termination cladding; and/or the output facet of the optical fiber termination may be configured to change a degree of divergence or convergence of light propagating therethrough and/or the article is further equipped with an auxiliary optical element affixed to the output facet, the auxiliary optical element having a non-uniform radial distribution of a refractive index and/or dimensioned to change a degree of divergence or convergence of light propagating therethrough.

Embodiments of the invention also provide a method of propagating light through an embodiment of the article of manufacture identified above. Such method includes a step of partially transmitting first light completely within a first glass medium through at least two immediately-neighboring dielectric boundaries in a first region of said first glass medium to form operationally useful light (here, each of the at least two immediately-neighboring dielectric boundaries in the first region separates areas of the first glass medium that have different refractive indices) and a step of propagating such operationally useful light only in one direction through a substantially cylindrical portion of an optical termination element while necessarily expanding a size of spatial distribution of this operationally useful light upon such propagating to define an output light at a distal end of the substantially cylindrical portion. The method may additionally include a step of channeling the operationally useful light from the at least two immediately-neighboring dielectric boundaries to the substantially cylindrical portion completely within a second glass medium while maintaining the size of the spatial distribution substantially constant during the process of channeling. Substantially in every implementation of the method, the process of propagating does not include totally internally reflecting the operationally useful light at a dielectric boundary, and the method may include— alternatively or in addition—a step of multiply circulating the first light between the at least two immediately-neighboring dielectric boundaries in the first region and at least two immediately-neighboring dielectric boundaries in a second region of the first glass medium (here, each of the at least two immediately-neighboring dielectric boundaries in the second region separates areas of the first glass medium that have different refractive indices). In the latter case, the process of multiply circulating may include multiply circulating the first light within a third glass medium while a second light is being coupled into the third medium. Alternatively or in addition—and substantially in every implementation of the method the process of propagating the operationally useful light may be configured to include passing the operationally useful light from the optical fiber component to the substantially cylindrical portion completely within bounds of a glass material and/or the method may additionally include a step of conveying the operationally useful light only in one direction through a section of glass material with an outer diameter that is different from an outer diameter of the optical fiber component and from an outer diameter of the substantially cylindrical portion. (in the latter case, the step of transmitting may be configured to include transmitting the operationally useful light from the chosen location to the distal end of the substantially cylindrical portion un-interruptingly through a glass material dimensioned to have an outer surface that is necessarily differentiable, and/or the step of transmitting may include transmitting the operationally useful light from the chosen location to the distal end un-interruptingly through a glass material dimensioned to have an outer surface that includes a sequence of conical surfaces (among which a first conical surface at an entrance of the substantially cylindrical portion has a first apex angle and a second conical surface separated from the substantially cylindrical portion by the first conical surface has a second apex angle, the second apex angle being larger than the first apex angle), and/or the step of transmitting may include transmitting the operationally useful light from the chosen location to the distal end through a plurality of coaxially positioned truncated cones of glass material spatially coordinated such that a top of one truncated cone forms a part of a base of another truncated cone. In at least one embodiment, the method includes a step of forming the operationally useful light at the chosen location separated from the other of the first and second locations by multiplicity of axially-distributed regions having different refractive indices, and/or the step of transmitting includes free propagation of the operationally useful light in a glass medium.

Alternatively or in addition, and substantially in every embodiment, the method may be configured to satisfy at least one of the following conditions: (a) the step of transmitting includes transmitting the operationally useful light through a curved surface separated from the chosen location by the substantially cylindrical portion (here, such curved surface is a surface of an optical lens component that has a non-zero optical power; and/or (b) the method includes transferring the operationally useful light through an auxiliary optical element affixed to the distal surface while changing the size of the spatial distribution of the operationally useful light during such transferring. (In the latter case, when such transferring occurs, the step of transferring may include transferring the operationally useful light through said auxiliary optical element that has a non-uniform radial distribution of a refractive index.)

Substantially in every embodiment, the method may additionally or in the alternative include at least one of the following: (i) prior to the step of partially transmitting, increasing irradiance of the light in a second glass medium that is separated from the substantially cylindrical portion by the at least two immediately-neighboring dielectric boundaries in the first region such that the increasing occurs at a wavelength defined at least in part by material content of the second glass medium; and (ii) forming the operationally useful light in the first glass medium that has doping content not including the dopant present in the second glass medium. (In one specific embodiment, when such increase of irradiance is carried out, the step of increasing the irradiance may be configured to necessarily include a process of multiply circulating light within the second glass medium between the first region of the first glass medium and at least two immediately neighboring dielectric boundaries in a second region of the first glass medium)

BRIEF DESCRIPTION OF THE DRAWINGS

For a more complete understanding of the disclosure, reference should be made to the following detailed description and accompanying drawing figures, of which.

Generally, the sizes and relative scales of elements in Drawings may be set to be different from actual ones to appropriately facilitate simplicity, clarity, and understanding of the Drawings. For the same reason, not all elements present in one Drawing may necessarily be shown in another. While specific embodiments are illustrated in the figures with the understanding that the disclosure is intended to be illustrative, these specific embodiments are not intended to limit the scope of invention implementations of which are described and illustrated herein.

DETAILED DESCRIPTION

The disclosure of each patent document and/or publication referred to in this application is incorporated herein by reference.

Embodiments of the present invention solve a persisting problem of inability of the systems of related art to effectively couple laser light where sufficiently-focused light either exceeds the damage threshold of the optical waveguide (for example, an optical fiber) and/or exceeds the ionization breakdown threshold of the medium (such as air, in one example) in which the process of coupling occurs. Notably, while rate of air ionization may depend on the wavelength of used light and/or a pulse duration, the thresholds for breakdown (for ~2 ns pulses in clean dry air at atmospheric pressure) were found to be in the power density range of $6*10^{11}$ W/cm$^2$ at 1064 nm; about $3*10^{11}$ W/cm$^2$ at 532 nm; and about $2*10^{12}$ W/cm$^2$ at 355 nm, which data provide a good assessment of the required levels for a single laser pulse. While repetition of pulses may lower the threshold, the laser damage thresholds are lower as well—and depending on a preparation of a surface the laser damage threshold may be as low as $10^4$ W/cm$^2$. (Understandably, embodiments of the invention may be employed in reverse—to outcouple light from the optical fiber.)

Figure 1A:
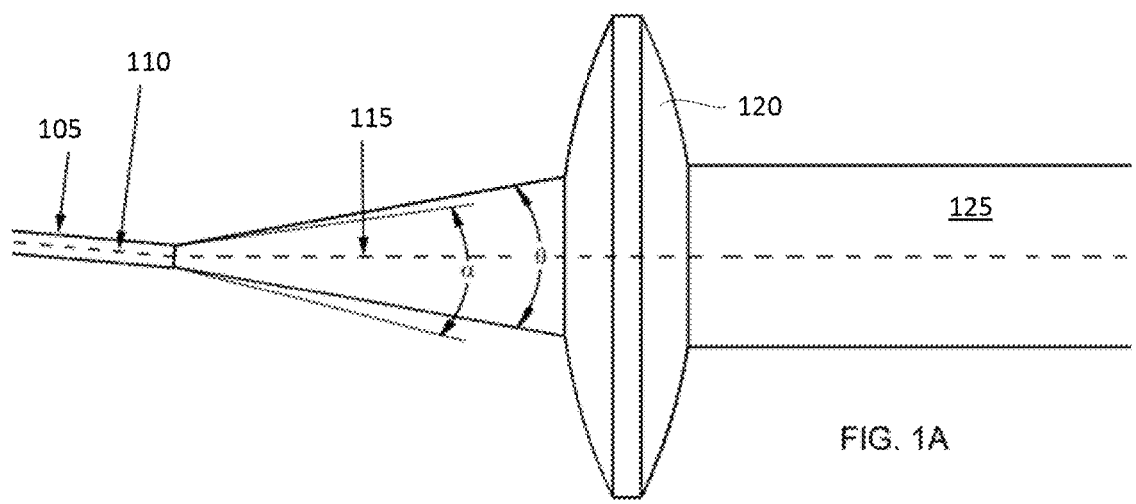
FIG. 1A and FIG. 1B illustrate schematically two typical causes of excitation of cladding modes in surgical fibers used with holmium lasers (— the holmium laser fibers), both resulting from defects in fiber termination defects often found in related art.
Figure 1B:
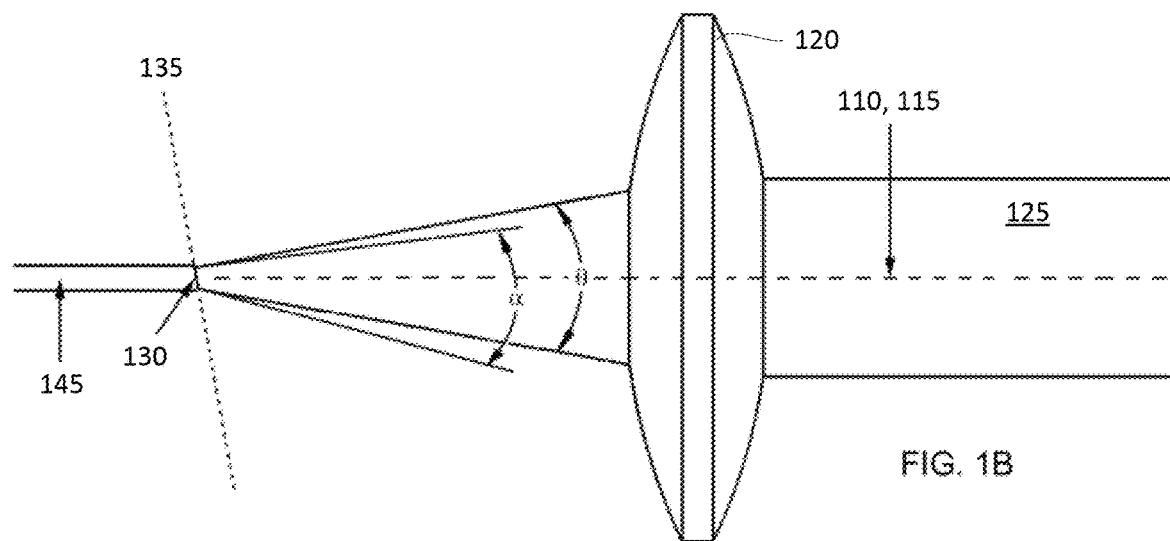
Figure 2A:
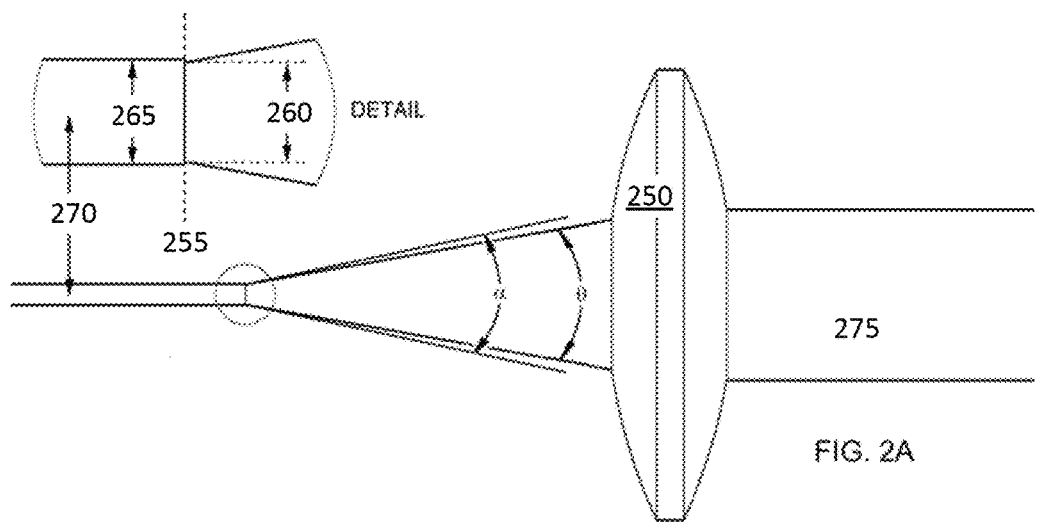
FIG. 2A and FIG. 2B illustrate schematically the effect of "blooming" of the output beam generated by a typical holmium laser, and its effect on coupling into a surgical optical fiber.
Figure 2B:
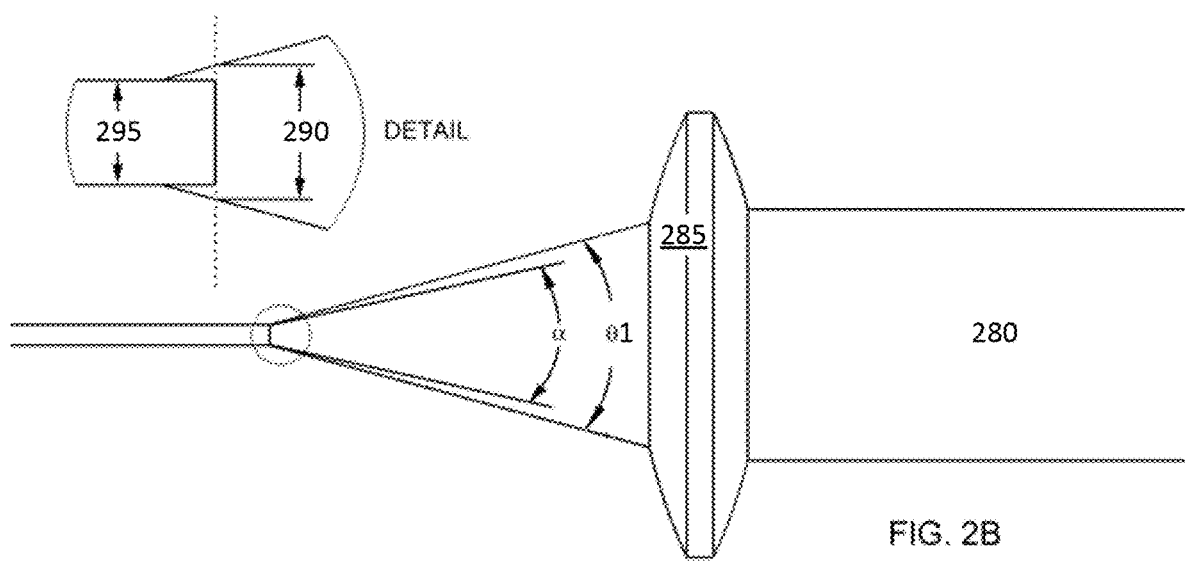
Figure 3:
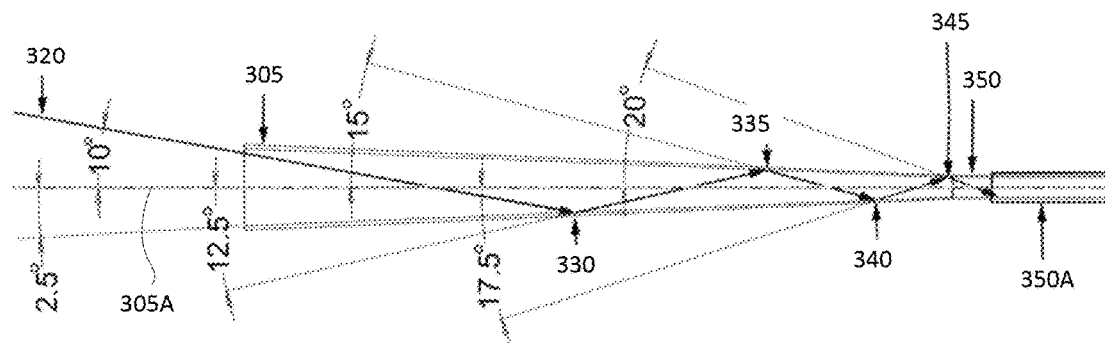
FIG. 3 presents a cross-section of a tapered segment of an optical fiber, showing the transformation of a high-order modes upon coupling to a fiber through such tapered segment.
Figure 6:
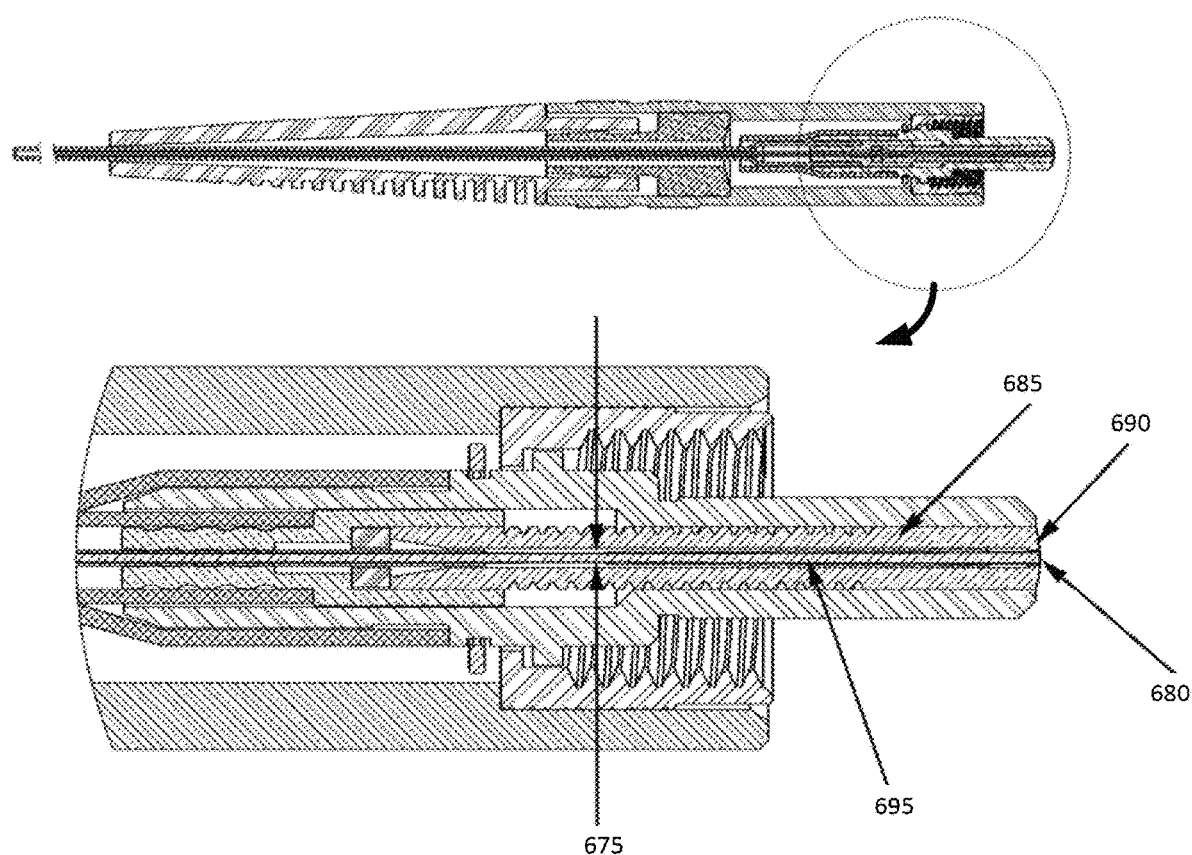
FIG. 6 depicts critical elements of a fiber optic termination discussed in U.S. Pat. Nos. 9,122,009 and 9,223,089.

In particular, embodiments of the invention described here minimize technical uncertainties and variations in some prior art parameters while eliminating other uncertainties altogether, thereby permitting reproducible efficiency that has not been demonstrated so far. Specifically, in reference to the related art solutions outlined in reference to FIGS. 3 and 6, for example, longer fiber tapers are inherently superior for guiding overfill energy into the original fiber core and NA, while shorter tapers are preferable for targeting the original core position with the input lens. Formation, and positioning of tapers in ferrules for fusion are inherently variable, as is angular position of the taper within the ferrule bore, forcing compromise in lens parameters.

A skilled artisan will readily appreciate that embodiments of the invention can be successfully employed for optical coupling fiber laser devices with target optical waveguides (such as optical fibers), thereby resulting in simplification of the processes of fabrication and/or assembly of the overall surgical optical-fiber based apparatus.

A skilled artisan will also readily appreciate that—as used in this disclosure and the appended claims—the term "cladding modes" refers to light propagating within the optical fiber that is not guided within the space defined by the glass-core boundary and the—glass—cladding boundary (that is, the light guided within the bounds of the glass cladding layer of the optical fiber) but, instead, is guided within a space defined between the boundary of the glass body of the optical fiber and the boundary of the polymer cladding of the fiber, regardless of the source of light. Multimode fibers that are used in holmium-laser-based surgery procedures are typically step-index and "doubly clad" fibers, in which the glass cladding layer is coated with a fluoropolymer coating having a refractive index lower than that of the fluorine-doped (F-doped) silica glass cladding of the fiber. A secondary numerical aperture (NA) of such fibers—of approximately 0.30 to 0.45—is thus formed by such polymer coating (polymer cladding, often referred to as "secondary cladding"). These fibers may be additionally buffered (or "jacketed") with a relatively thick layer of a polymer, typically ethylene tetrafluoroethylene (ETFE) copolymer (refractive index of about 1.4 @ 633 nm) that is dyed blue or green to form what is often referred to as a "jacket layer" (or jacket, for short) with enhanced visibility, which is important in the surgical field.

Figure 7:
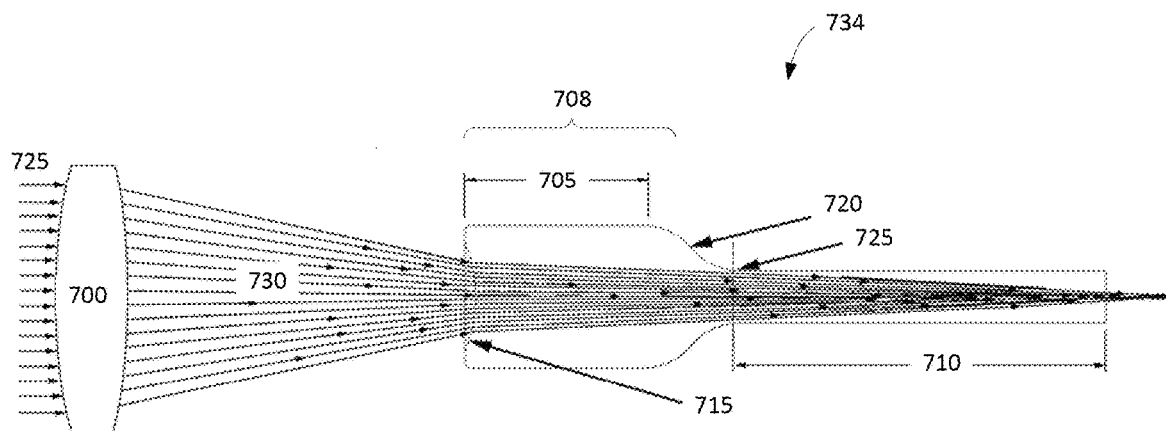
FIG. 7 illustrates one embodiment of the optical fiber termination.

As shown schematically in FIG. 7, which represents an embodiment of the invention, a laser's collimated light output 725 is shown to be converged, 730, by a single optic (which is typical in the art of surgical lasers; shown here as a lens 700) and focused onto an input curved facet of an optical fiber system 734, which materially and optically combines the conventional surgical fiber 710 with an optical head region (the region of OF termination) 708. The optical head section is, substantially, a cylindrical body exhibiting substantially the same material structure as the fiber 710. Specifically, the head 708 has the axial core region and the co-axial glass cladding region (which could be imagined in a cross-sectional view) just like the optical fiber 710 with the exception that, in the optical head 708, both the dimension of the core and that of the glass cladding are proportionately expanded (increased, as compared to those of the fiber 710) to such values that the front/input surface of the head 708 could support the concave refracting surface 715 that, in turn, is dimensioned to substantially completely accept laser light in the focal spot formed by the converging beam 730 and to focus such light (upon refraction through the surface 715 into the optical head 708) onto the cross-sectional surface 725 of the structure 734, where the regions of spatially-expanded core and the spatially-expanded glass cladding of the head 708 end and the core and the glass cladding of the regular fiber 710 begin. The so-defined surface 725—that is, the surface beyond which, as seen from the head 708, the dimension(s) of the glass core region of the structure 734 and the dimension(s) of the glass cladding region of the structure 734 are substantially equal to those of the fiber 710—is defined as an input surface or facet of the fiber 710, at least for the purposes of the appended claims.

In at least one implementation—for example in the case when the head 708 is made from a preform from which the fiber 710 is drawn—the ratio of a thickness of the glass cladding region of the optical head 708 to the diameter of the core region of the optical head 708 is substantially equal to that of the fiber 710.

The lensing surface 715 is judiciously dimensioned to change—and, in this example—to reduce the rate of convergence of laser light upon traversing the surface 715. In the example of FIG. 7, the adiabatic merging between the optical head 708 and the conventional fiber 710 is shown to be carried out in a transition region or section 720 (which may optionally be considered to be a part of the head 708). Throughout such transition region 720, both the diameter of the core portion of the head 708 (which is maintained to be substantially constant along at least a larger portion 705 of the head 708) and the diameter of the glass cladding of the head 708 (which is maintained to be substantially constant along at least the same portion 705) are gradually reduced toward the values of the diameter of the core and the diameter of the glass cladding of the fiber 710. At the surface 725, the core and glass cladding regions of the head 708 are seamlessly merged into, respectively, the core and glass claddings of the fiber 710, in a substantially tangentially-parallel fashion. (In other words, at the input surface of the fiber 710, a tangent to the surface of the core of the fiber and a tangent to the surface of the core of the transition region 710, both drawn in a plane containing the optical fiber axis are substantially co-incident with one another, while a tangent to the surface of the cladding of the fiber and a tangent to the surface of the cladding of the transition region 710, both drawn in the same plane containing the optical fiber axis, are also substantially co-incident with one another.)

Optionally, and in a related implementation, the cylindrical portion of the head 708 may be merged with the cylindrical body of the fiber 710 without a transition section—in a step-like fashion (in which case, understandably, there will be a spatial disconnect between the corresponding core regions and/or corresponding glass cladding regions of the portions 708 and 710 of the structure 734). In any case, the portion of the structure 734 preceding the fiber section 710 is configured such that, all the way throughout the axial extent of the structure 734 between the lensing surface 715 and the surface 725 (at which the body of the conventional fiber 710 begins), laser light coupled into the structure 734 through the surface 715 is continually and un-interruptingly converging. At the surface 725, the rate (or angle) of such convergence is configured to correspond to the accepting NA of the fiber 710. Optionally, such convergence may be effectuated at a substantially constant rate throughout the head 708.

Due to the fact that the materials of the core region and the glass cladding region— and, therefore, the indices of refraction of the core region and the glass cladding region—of the head 708 (with or without the transition section 720) are the same as those of the core and glass cladding regions of the fiber 710, there is no internal reflection of laser light coupled into and propagating through the structure 734.

Figure 4:
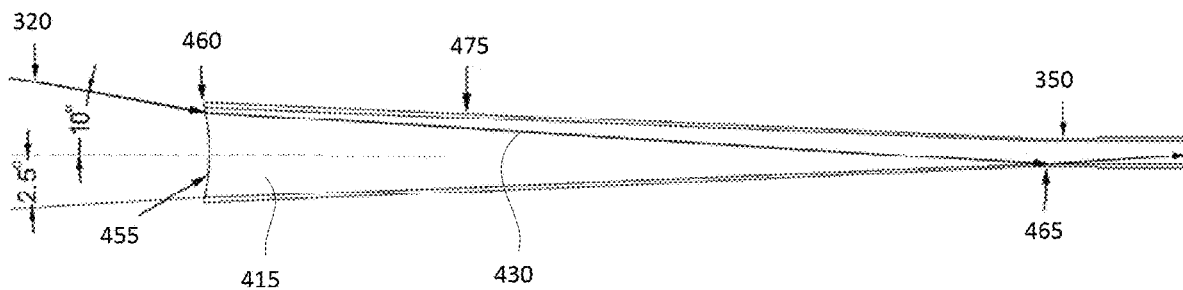
FIG. 4 presents the combination of the same taper input section (as that depicted in FIG. 3) but with a re-structured input facet, the operation of which affects propagation of a high order laser mode through the taper section such as to avoid the conversion to modes propagating at higher angles with respect to the optical axis (see, for example, U.S. Pat. No. 7,488,116)
Figure 5:
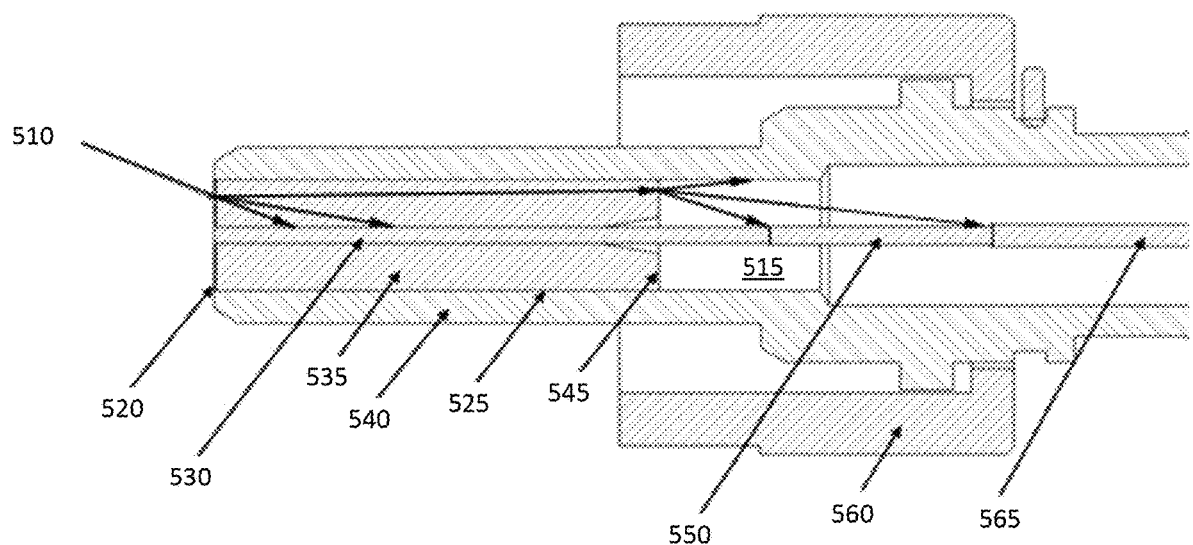
FIG. 5 illustrates a quartz ferrule sleeved optical fiber termination with integral beam scattering elements (per Brown in U.S. Pat. No. 7,090,411)

A skilled artisan will readily appreciate that FIG. 7 depicts a construct configured such that various critical dimensions may be precisely maintained (as compared with inability of related art to do so) and—in particular—the absolute axial starting position, 725, of the core of the conventional, substantially-constant diameter and the axial position of the input surface 715. In practice, the dimensions of the head 708 (with or without the transition region 720) are easily maintained with high precision and compatible with focal lengths of the lens formed by the surface 715 that may be produced in the available glass materials, thereby—as compared with the embodiments similar to those of FIG. 3 and FIG. 4, for example—obviating the need for a tapered wall and, therefore, the need in a tapered section completely. Furthermore—and in comparison with an embodiment similar to that of FIG. 6—the contraption 734 does not require an accessory quartz ferrule (685, as in FIG. 6, that is fused 690 about the taper 695 to produce a larger surface upon which to form a functional lens). Understandably, an embodiment of FIG. 7 can be operable and operational in reverse—that is, to outcouple light from the optical fiber element 710 towards the open space or a target optical component/device.

Figure 8:
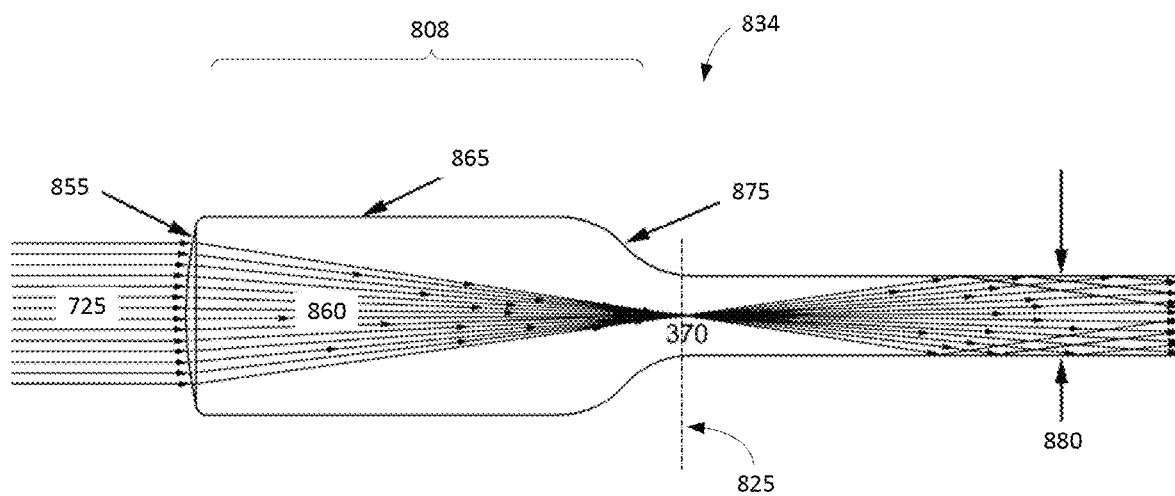
FIG. 8 depicts a related embodiment of the optical fiber termination.

FIG. 8 illustrates an embodiment related to that of FIG. 7. Specifically, FIG. 8 depicts an embodiment of the optical fiber structure 834 containing an OF termination (section 808) configured to couple laser light, into a conventional surgical fiber 880, at a power level that would otherwise damage the input surface of the fiber 880 is such laser light were focused on the input surface directly; or at a power level that would otherwise ionize the air around the fiber 880 if focused sufficiently to be coupled directly into the fiber 880. In this example, collimated laser beam 725 is acquired by the OF termination (head) portion 808 through its front surface (facing the laser source of light) that is dimensioned to define a convex lens element at such front surface and, having traversed the lensing surface 855, propagates through the body of the section 808 while converging towards the fiber section 880. (The skilled person will appreciate that the embodiment 834 is also configured to ensure that a degree of convergence of light, received and accepted at the front surface of the OF termination 808, is changed upon transmission through such front surface)

The material configuration/structure of the head 808 at least in one case may be substantially similar to that of the head 708 (of FIG. 7). For example, at least along a larger portion 865 of the length of the section 808, the section 808 may be structured as a spatially-expanded version of the fiber 880 and dimensioned such that the waist of the spatially-converging (internally to the head 808) beam 860 that contains highest density of radiant power occurs within the body of the glass material (for example, at or near the diameter transition section 875. The transition section 875, if and when present, is preferably structured in a fashion similar to that discussed in reference to FIG. 7. The head region 808 is materially and optically merged with the fiber 880 at a surface 825 which, as was already alluded to above in reference to the surface 725 of FIG. 7,—is the input surface of the fiber 880, that is a surface beyond which, as seen from the head 808, the dimension(s) of the glass core region of the structure 834 and the dimension(s) of the glass cladding region of the structure 834 are substantially equal to those of the fiber 880. In at least one specific implementation, the structure 834 is dimensioned such that, at the input surface of the optical fiber, the core of the termination element 808 and a core of the fiber 880 are co-axially merged with one another in a tangentially-parallel fashion, while the cladding of the termination element 808 and that of the fiber 880 cladding are also co-axially merged with one another in a tangentially-parallel fashion. Understandably, an embodiment of FIG. 8 can be operable and operational in reverse—that is, to outcouple light from the optical fiber element 880 towards the open space or a target optical component/device.

Figure 9:
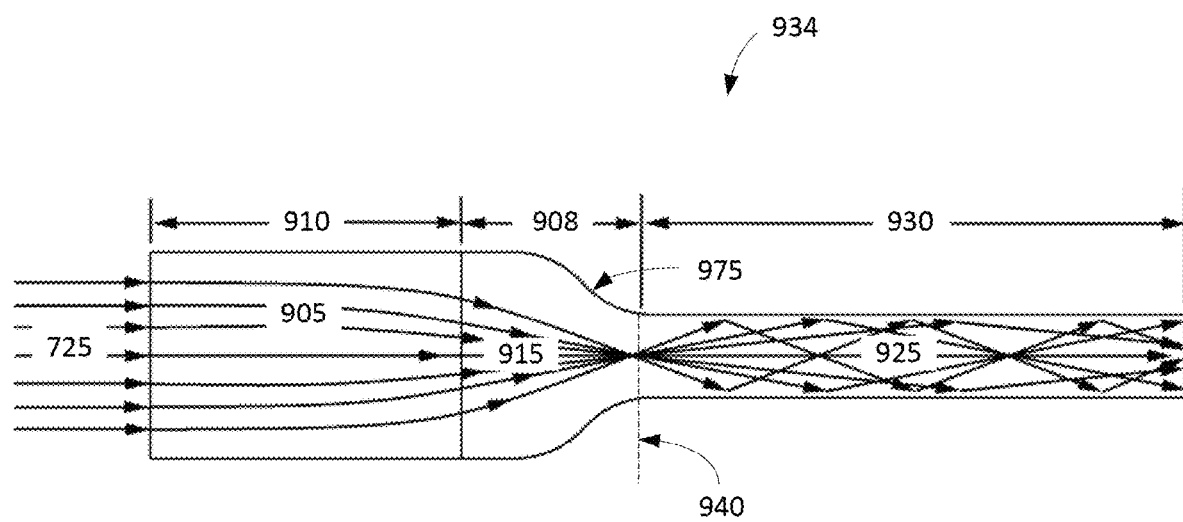
FIG. 9 depicts yet another related embodiment of the optical fiber termination.

A related implementation of the system 934, schematically illustrated in FIG. 9, provides an OF termination (to the surgical optical fiber 925) structured to include two main portions: a head 908 (having a core region and a glass cladding region, and fabricated in the same fashion the fiber 925 is fabricated, and structured as discussed above in reference to heads 708, 808 of FIGS. 7, 8) and a front bulk glass cylinder 910 configured as an accessory lens, in this case a Gradient Index lens (or GRIN lens), in ~¼ pitch length, fused with the head 908. The head 908 generally may or may not have a transition region at region of attachment to the fiber 910 and in the example of FIG. 9 such transition region is present, depicted as 975, and structured by analogy of transition regions 720, 875 described in reference to FIGS. 7, 8. As shown—and in at least one implementation the input and substantially collimated light 725 may be an output from the surgical laser (such a s a holmium laser) with an $M^2$ factor on the order of about 25 or higher, which is accepted by the bulk lens 910 and converged through the head 908 into a beam waist 915. The gradient index lens portion is dimensioned to ensure that the waist 915 of the converging beam 905 is located at or near the diameter transition region 975 (when present) or at an input surface 940 of the optical fiber 925.

In at least in one specific implementation, the structure 934 is dimensioned such that, at the input surface 940 of the optical fiber, the core of the head 908 and a core of the fiber 880 are co-axially merged with one another in a tangentially-parallel fashion, while the cladding of the head 908 and that of the fiber 880 cladding are also co-axially merged with one another in a tangentially-parallel fashion. Understandably, an embodiment of FIG. 9 can be operable and operational in reverse—that is, to outcouple light from the optical fiber element 925 towards the open space or a target optical component/device.

In at least one implementation of an embodiment of any of FIGS. 7, 8, and 9, the length of the head portion 708, 808, 908 of the optical fiber termination may be about 1.5 mm to about 5 mm in length (preferably, about 1.5 to about 3 mm in length) with an outer diameter of about 1 mm to about 2 mm (and the core diameter being about 80%, about 90%, or about 95% of the value of the outer diameter of the head, depending on the specifics of a particular implementation). The so-dimensioned optical termination facilitates the situation when laser light (during the process of converging inside the bulk of the head portion) substantially avoids interaction with a boundary between the glass core and glass cladding regions of the head portion—for example, no total internal reflection on such boundary occurs.

In one related embodiment, a fiber termination contraption includes an optical fiber having a terminus, adjacent to the terminus a clad fiber and distal from the terminus and adjacent to the clad fiber a polymeric-coated fiber. The clad fiber includes a silica core and an F-doped silica cladding and the polymeric-coating fiber includes the clad fiber carrying one or more polymeric coatings. The fiber termination also includes an expanded core section proximal to the unaltered fiber core, and clad. The transition from expanded core to unaltered core is abrupt such that modes entering the expanded core at angles unsupported by the fiber core-cladding NA are not guided, but leak in a generally distal direction.

In another related embodiment, a method for manufacturing an optical fiber termination includes providing an optical fiber with a denuded portion adjacent to a terminus; then forming an expanded section by controlled heating of the denuded glass fiber. The process may additionally include positioning overfill glass tube on denuded fiber section prior to expanding the core and cladding.

Figure 10:
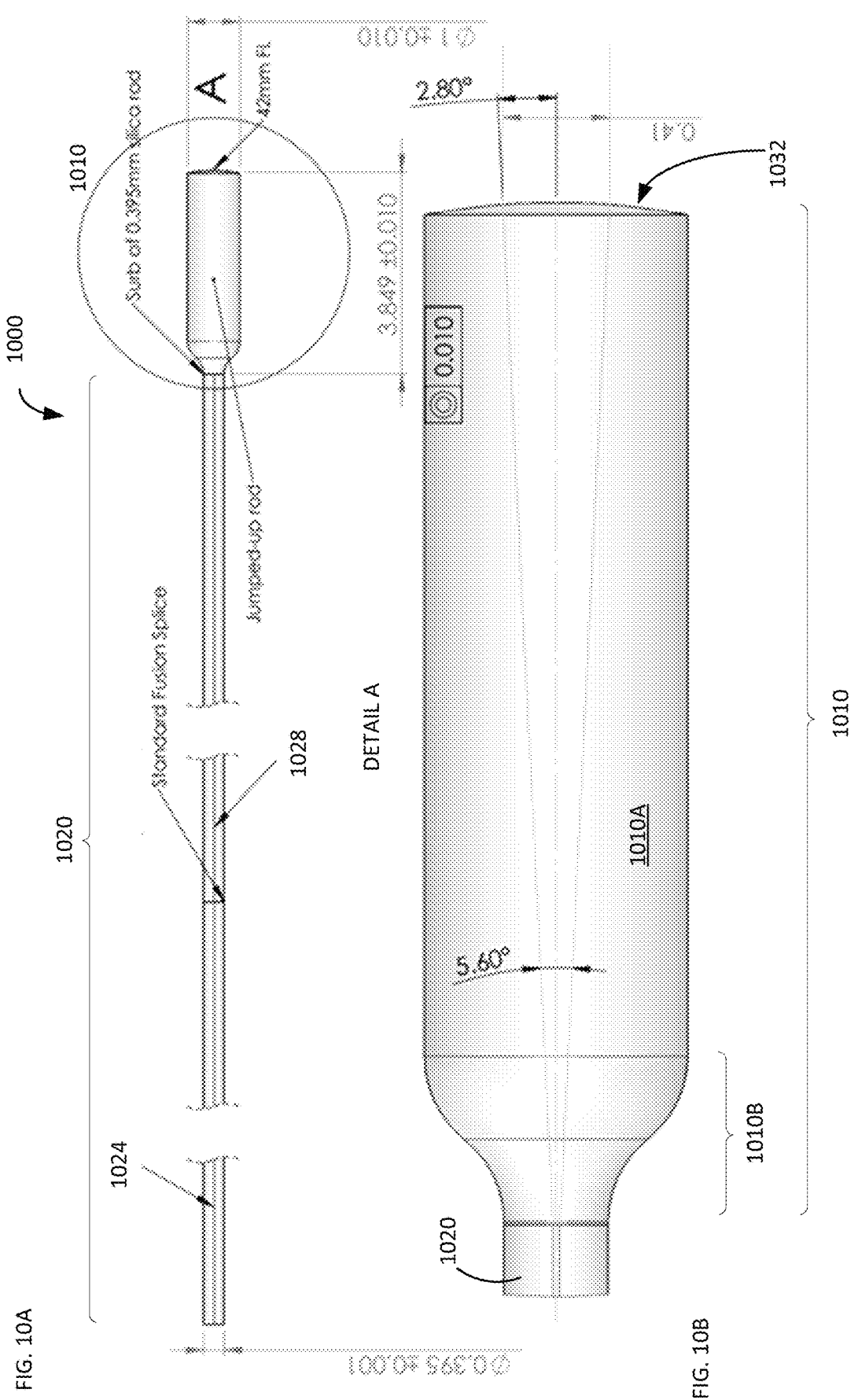
FIGS. 10A, 10B schematically illustrate an embodiment of the article of manufacture that includes at least a distributed light reflector built into an optical fiber and an optical fiber termination structured to ensure that the optical mode of the optical fiber propagates through such termination without forming back reflections.

FIGS. 10A and 10B schematically illustrate an embodiment 1000 of the apparatus of the invention that employs an optical termination structure 1010 (identified in inset A and in FIG. 10B) solidly and in a tangentially parallel manner cooperated with a constituent optical fiber component 1020, at least one portion of which includes multiple dielectric boundaries (arranged cross the axis of the component 1020 to separate respectively-corresponding multiple regions of the optical fiber having different distributions of refractive index(es) and, therefore, different effective refractive index(es) for the optical mode(s) of such optical fiber component) that are configured to form an axially-directed reflection of light propagating through the component 1020. All dimensions identified in FIGS. 10A and 10B are those for a specific example and are non-limiting, In at least one implementation, the optical fiber component 1020 is configured to operate as a fiber amplifier and/or a fiber laser (for example, to carry/contain two diffraction Bragg gratings separated by a region of the optical fiber configured as a gain medium), while the optical termination is necessarily and judiciously configured such as to form no reflection of light of the optical mode supported by the component 1020 and to ensure a singly-directional propagation of such optical mode away from the component 1020 through the optical termination 1010.

The optical termination 1010 is shown to include a substantially cylindrical body 1010A of a glass material and an intermediate glass body 1010B, which at one end is seamlessly (that is, without an awkward transition, an interruption, or an indications of disparity) connected to the optical fiber component 2020 and at another end—seamlessly connected to the body 1010A. In at least one specific case, while so connected, the outer surfaces of the bodies 1010A and 1010B are merging with one another in a substantially tangentially parallel fashion and/or fully differentiable fashion.

The intermediate body 1010B provides an optical transition between the constituent optical fiber 1020 and the substantially cylindrical body 1010A and—to ensure that the construction of the apparatus 1000 remains a one-piece construction that does not produce a reflection of light at the boundary between the elements 1020 and 1010—may be made of the same material as the portion of the fiber 1020 immediately neighboring the body 1010B and fused with this portion of the fiber 1020. In one implementation, for example, when the optical fiber termination 1010 is made of silica glass—as shown in the example of FIG. 10A—the optical fiber component 1020 may include at least a portion 1024 that is configured as a medium providing gain for light at a pre-determined wavelength (for example, the portion 1024 may be an optical fiber with a Tm-doped core and numerical aperture NA of about 0.07), while the portion 1028 of the optical fiber component 1020 may be configured as a silica core/silica cladding fiber with a numerical aperture of about 0.1. As shown in the example of FIG. 10B, the optical termination 1010 has a fully differentiable outer surface and is dimensioned to ensure that the propagation of the optical fiber mode delivered by the element 1028 to the body 1010B propagates through the termination 1010 while necessarily spatially expanding at a substantially constant rate (here, as shown, at an angle of about 5.6 degrees) and not forming a reflection at a dielectric surface until it reaches the output facet 1032 of the termination 1010.

Substantially in any implementation of the apparatus, the output facet 1032 of the termination 1010 can include a curved surface which—when light delivered to such surface from the body 1010B traverses this surface—changes a degree of spatial convergence/divergence of such light. As shown in FIG. 10B, the surface 1032 may be configured to produce a light focusing effect (that is, to operate as a lens element with a positive optical power). In a related embodiment, the surface of the output facet 1032 can be made concave to operate as a negative lens element.

Referring again to the constituent optical fiber component 1020 of an embodiment of the apparatus, such component may include a stretch of reflective optical fiber (not shown) that carries/includes a multiplicity of immediately-neighboring each other dielectric boundaries arranged across the axis of the component (which boundaries separate the respectively corresponding regions of optical fiber that have difference effective refractive index(es) for a chosen mode of such optical fiber). When judiciously configured, such multiplicity of dielectric boundaries may be used to form a distributed Bragg reflector for a fiber mode supported—and optionally amplified—by the fiber stretch 1024. When complemented with another substantially identical reflective optical fiber and the optical fiber element 1024, the apparatus may be configured to contain an optical fiber laser device. Optionally, the glass content of the reflective optical fiber may be different from that of the fiber gain medium 1024 (and contain, in one example, the dopants of Ge and Tm, respectively).

Figure 11:
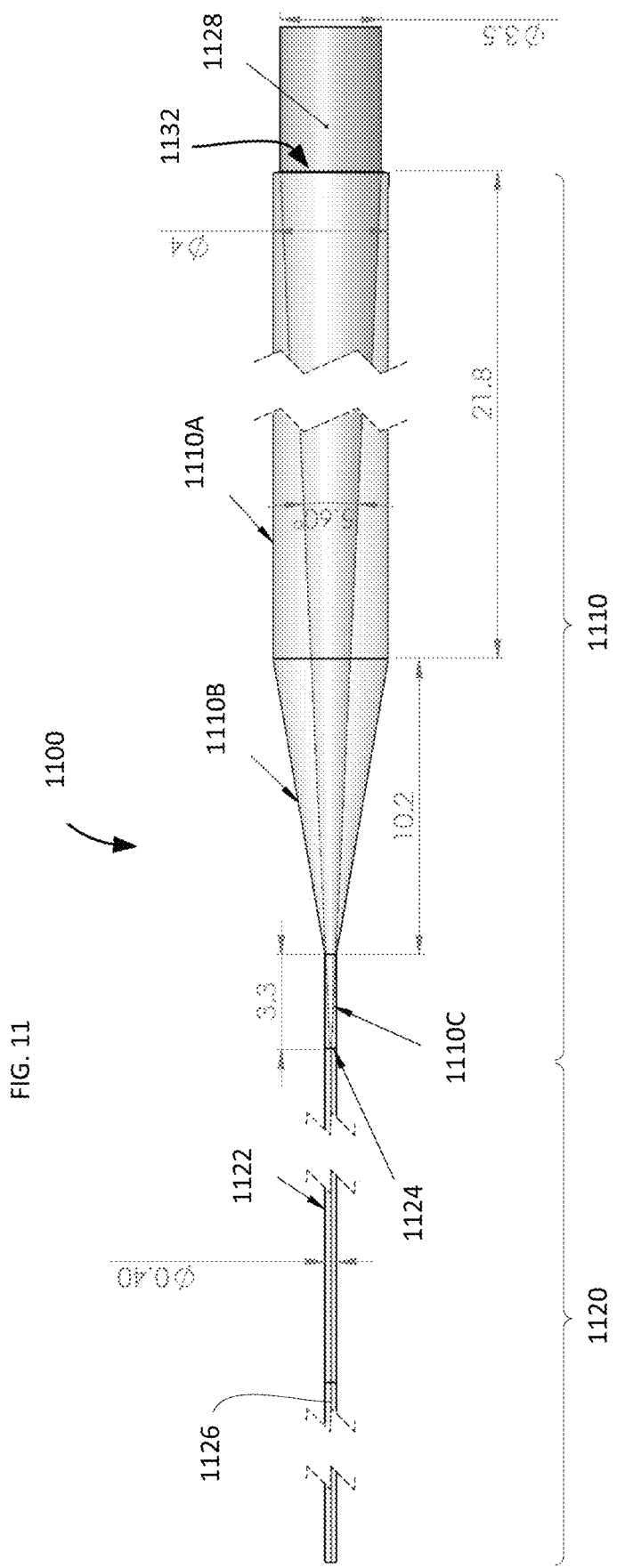
FIGS. 11, 12, 13A, 13B illustrate related embodiments of the invention.

FIG. 11 illustrates a related embodiment of the apparatus, in which the optical fiber component 1120 is seamlessly fused with the optical termination 1110. (Dimensions, as shown are non-limiting and used for the sake of example only.) The optical fiber termination 1120 can be fabricated, for example, from a silica rod that is laser-machined to have a portion of it conically reshaped, 1010B, leaving a stub or tail 1010C for fusion splice with the optical fiber component 1120. In this example, the intermediate body of the optical termination includes two parts—a substantially conical portion 1110B extending, at the input end facing the fiber component 2020, with a stub or tail 1110C that is appropriately fused with a portion 1122 of the optical fiber component 1120 that carries at least two dielectric boundaries formed in the body of the portion 1122 across the fiber axis. The termination 1110 is configured such that spatial divergence of the optical mode of the optical fiber component 1120 delivered to the termination 1120, begins substantially in the region of fusion 1124 and continues as a substantially constant rate (here, at about 5.6 degrees) and without an internally formed back reflection upon a strictly unidirectional propagation through the optical termination 1110 to form an output beam 1128 of about 3.5 mm in diameter at the output facet 1132 configured as a substantially light-collimating lens and an output window carrying the anti-reflection coating. The transition between the outer surfaces of the conical portion 1110B and the body 1110A is preferably—but not necessarily—arranged in a tangentially-parallel manner. The optical fiber element of the component 1120 that is optionally configured as a gain medium is denoted as 1126.

Figure 12:
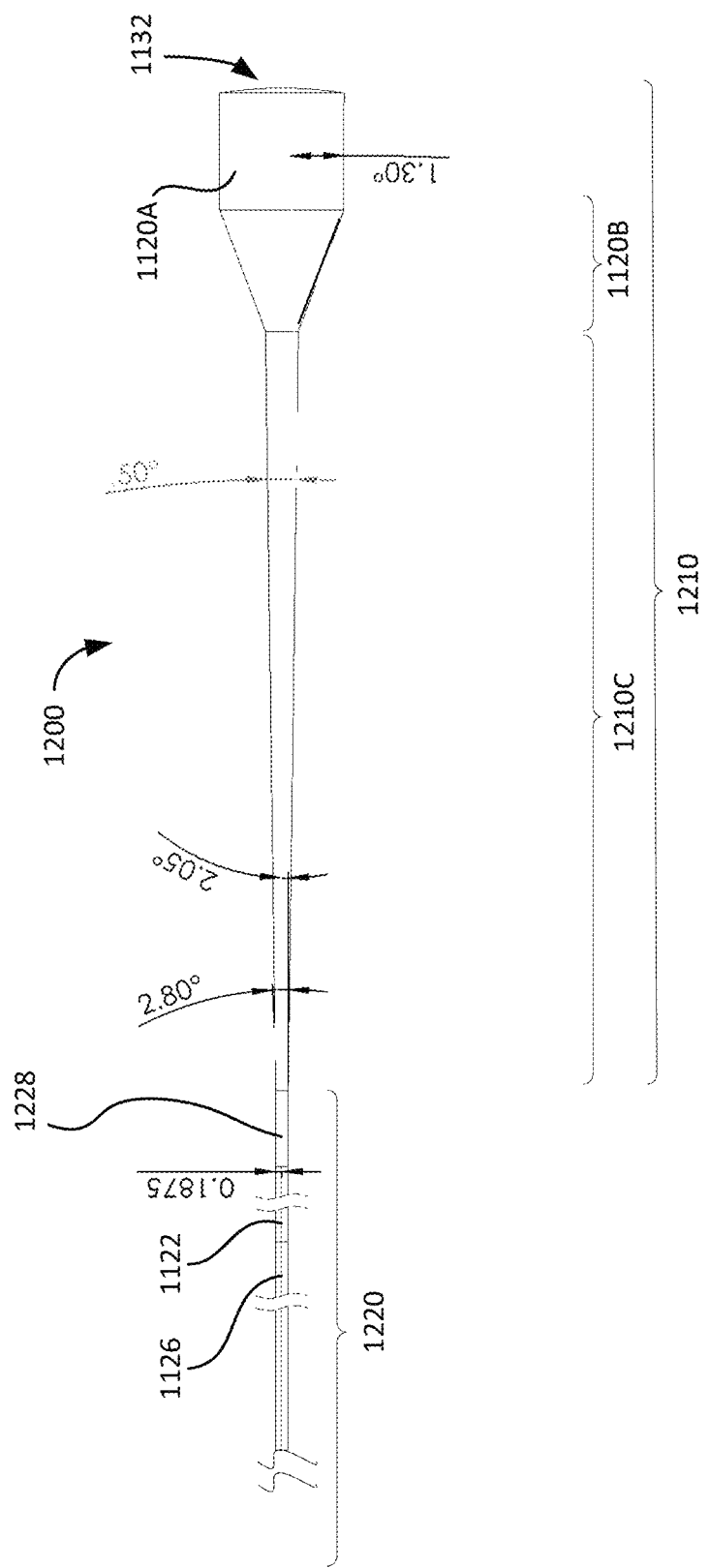

FIG. 12 provides a schematical illustration of an embodiment 1200 related to that of FIG. 11 but in which the cross sectional dimension of the stub or tail 1210C of the termination 1210 (which is fusion spliced with the silica portion 1228 of the optical fiber component 1220) is non-uniform and is sized in such a fashion as to ensure that the angle of spatial divergence of the optical mode propagating through the tail 1210C is changing (in this case—reducing) at least once prior to reaching the conical portion 1110B. As is schematically indicated here, the tail 1210C includes three sub-stretched (sub-regions) with difference apex angles providing for the half-angle of divergence of the optical mode is about 2.8 degrees, 2.05 degrees, and 0.5 degrees. As a result, the upper value of the half-angle of divergence of the optical mode propagating through the substantially cylindrical body 1120A of the termination 1210 unidirectionally and without internal back reflections is reduced to about 1.3 degrees (as compared with that of about 2.8 degrees in the embodiment 1100).

The use of the transitional multi-cone region dimensioned with an angle shallower than the divergence angle of the optical mode thereby preserves more of the beam quality by reducing the divergence as the diameter of the terminal is increased away from the optical fiber component 1220. Such configuration, understandably, also makes the collimation of the output beam at the lens element formed at the output facet 1132 less prone to producing a Fresnel reflection.

Figure 13A:
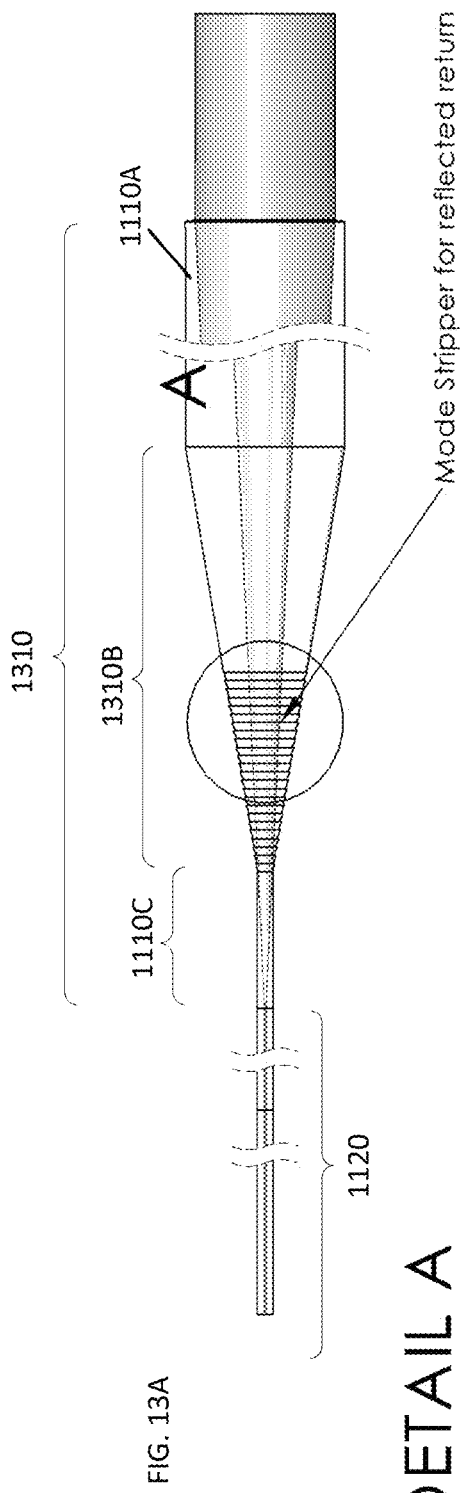
Figure 13B:
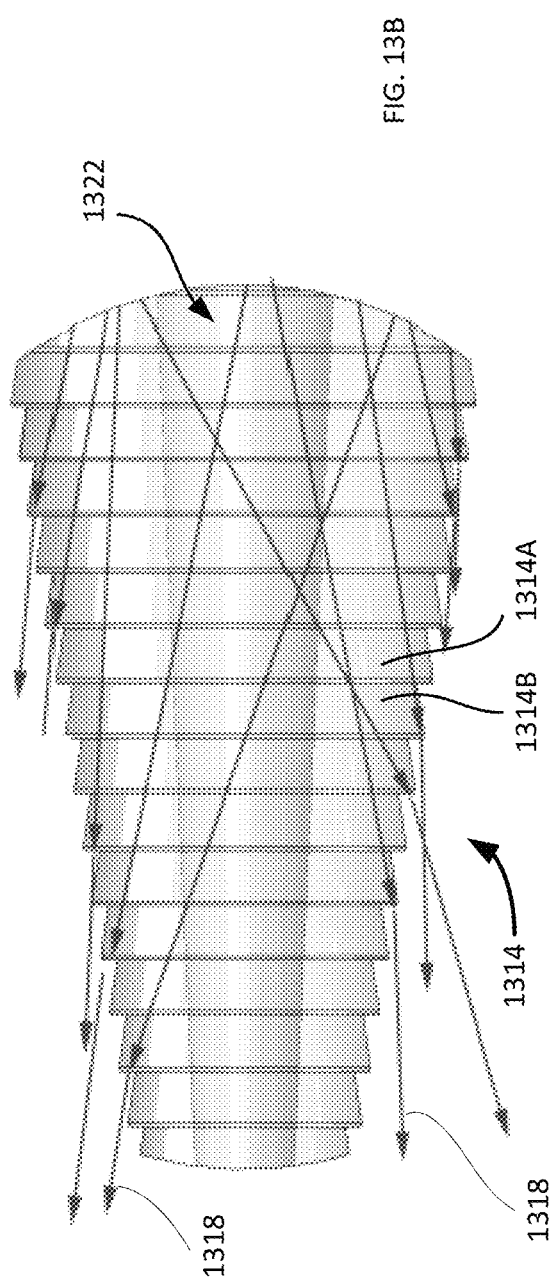

FIGS. 13A, 13B provide a sketch of yet another related embodiment 1300, in which a portion 1314 of the optical termination 1310 is configured as an optical mode stripper. Here—as compared with the embodiment 1110 of FIG. 11, for example—a stretch of the substantially conical part 1310B of the termination 1310 is appropriately dimensioned as a multiplicity of coaxially positioned truncated cones (of glass material, for example, silica glass) spatially coordinated with one another such that a top of a first truncated cone 1314A forms a part of a base of a second (immediately-neighboring) truncated cone 1314B, which ensures that higher order spatial modes which—if present—would destabilize the operation of the fiber laser (when present in the optical fiber component 1320) or even damage the active (gain) core of such laser—are removed from the lightguide portion by being outcoupled outside of the topical fiber (as indicated with arrows 1318) and light 1322, propagating through the termination 1310, does not produce reflections delivered back to the optical fiber component 1320. Notably—while in at least one case the optical fiber terminations 1010, 1110, 1210, 1310 are made of a bulk glass material such as silica, in a related case at least one of such fiber terminations can have a structure analogous to that of an optical fiber (for example, be made from an optical fiber preform) and have a termination core and a fiber termination cladding. When this is the case, in at least one implementation the apparatus can be configured such that a first ratio of the termination core diameter to a termination cladding diameter is substantially equal to a second ratio of a core diameter to the cladding diameter of the optical fiber component that is complemented with such fiber termination.

A skilled person having the advantage of the above disclosure will readily appreciate that at least one embodiment of the invention (the one in which the optical fiber component complemented with an optical termination is configured to include an optical resonator) provides a method for propagating light. Such method includes a step of multiply circulating light along an optical fiber component between first and second axial locations of the optical fiber component to form operationally useful light at a chosen location of the optical fiber component (the chosen location is separated from the first axial location by the second axial location) and a step of transmitting the operationally useful light only in one direction through a substantially cylindrical portion of an optical termination element while necessarily expanding a size of a spatial distribution of such operationally useful light upon so transmitting to define an output light at a distal end of the substantially cylindrical portion. A method may additionally include a step of causing the operationally useful light to pass to the substantially cylindrical portion from the optical fiber component without traversing free space. (In one specific case, such causing includes passing the operationally useful light through the substantially cylindrical portion while not forming a total internal reflection of the operationally useful light and/or passing the operationally useful light from the optical fiber component to the substantially cylindrical portion completely within bounds of a glass material.) Alternatively or in addition- and substantially in every implementation—the method may be configured to convey the operationally useful light only in one direction through a section of glass material with an outer diameter that is different from an outer diameter of the optical fiber component and from an outer diameter of the substantially cylindrical portion. Here, while so conveying and optionally, one or more of the following conditions is satisfied: the step of transmitting may include transmitting the operationally useful light from the chosen location to the distal end un-interruptingly through a glass material dimensioned to have an outer surface that is necessarily differentiable; the step of transmitting may include transmitting the operationally useful light from the chosen location to said distal end un-interruptingly through a glass material dimensioned to have an outer surface that includes a sequence of conical surfaces (here, a first conical surface at an entrance of the substantially cylindrical portion has a first apex angle and a second conical surface separated from the substantially cylindrical portion by the first conical surface has a second apex angle, the second apex angle being larger than the first apex angle); the step of transmitting may include transmitting the operationally useful light through a sequence of multiple coaxially positioned truncated cones of glass material spatially coordinated such that a top of one truncated cone forms a part of a base of another truncated cone. Alternatively or in addition—and substantially in every implementation of the method—the method may include a step of forming the operationally useful light at the chosen location separated from the other of the first and second locations by multiplicity of axially-distributed regions having different refractive indices; and/or include free propagation of the operationally useful light in a glass medium. In at least one embodiment, of the method, the optical fiber component is configured to have a fiber core and a fiber cladding, and the step of transmitting includes transmitting the operationally useful light through the optical termination element that has a termination core, and a termination cladding. In this specific case, a first ratio of a termination core diameter to a termination cladding diameter is maintained substantially equal to a second ratio of a fiber core diameter to the fiber cladding diameter. (In one specific case when the latter requirement is met, the step of necessarily expanding is carried out such as to not form a total internal reflection of the operationally useful light at a boundary between the termination core and the termination cladding.) Furthermore—and substantially in every implementation of the method—at least one of the following conditions may be satisfied: (a) the step of transmitting may include transmitting the operationally useful light through a curved surface separated from the chosen location by the substantially cylindrical portion (here, the curved surface is a surface of an optical lens component that has a non-zero optical power); and/or (b) the method additionally includes a step of transferring the operationally useful light through an auxiliary optical element affixed to the distal surface while changing the size of the spatial distribution during such transferring. (In a specific case of the latter embodiment, when the transferring occurs, such transferring may include transferring the operationally useful light through the auxiliary optical element that has a non-uniform radial distribution of a refractive index; and/or the method may addition include the step of directly coupling the output light from said curved surface and/or the auxiliary optical element to a target optical element such as an optical fiber while traversing only free space located in between and not interacting with an additional optical device, and/or at least shaping the output light as a substantially collimated beam of light. Alternatively or in addition, and substantially in every implementation of the method, at least one of the following conditions is satisfied: the step of multiply circulating may include (i) increasing irradiance of light, which is being circulated between the first and second locations of the optical fiber, at a wavelength defined at least in part by a first dopant present in a region between the first and second axial locations; and (ii) the step of forming the operationally useful light at the chosen location may include forming the operationally useful light in a portion of the optical fiber having doping content that does not include a dopant present between the first and second axial locations.

In yet another related embodiment, a method for manufacturing an optical fiber termination includes fusing a silica tube to a terminus of a clad fiber; and forming one or more furrows in an exterior surface of the silica tube.

References throughout this specification to "one embodiment," "an embodiment," "a related embodiment," or similar language mean that a particular feature, structure, or characteristic described in connection with the referred to "embodiment" is included in at least one embodiment of the present invention. Thus, appearances of the phrases "in one embodiment," "in an embodiment," and similar language throughout this specification may, but do not necessarily, all refer to the same embodiment. It is to be understood that no portion of disclosure, taken on its own and in possible connection with a figure, is intended to provide a complete description of all features of the invention.

For the purposes of this disclosure and the appended claims, the use of the terms "substantially", "approximately", "about" and similar terms in reference to a descriptor of a value, element, property or characteristic at hand is intended to emphasize that the value, element, property, or characteristic referred to, while not necessarily being exactly as stated, would nevertheless be considered, for practical purposes, as stated by a person of skill in the art. These terms, as applied to a specified characteristic or quality descriptor means "mostly", "mainly", "considerably", "by and large", "essentially", "to great or significant extent", "largely but not necessarily wholly the same" such as to reasonably denote language of approximation and describe the specified characteristic or descriptor so that its scope would be understood by a person of ordinary skill in the art. In one specific case, the terms "approximately", "substantially", and "about", when used in reference to a numerical value, represent a range of plus or minus 20% with respect to the specified value, more preferably plus or minus 10%, even more preferably plus or minus 5%, most preferably plus or minus 2% with respect to the specified value. As a non-limiting example, two values being "substantially equal" to one another implies that the difference between the two values may be within the range of +/−20% of the value itself, preferably within the +/−10% range of the value itself, more preferably within the range of +/−5% of the value itself, and even more preferably within the range of +/−2% or less of the value itself. The use of these terms in describing a chosen characteristic or concept neither implies nor provides any basis for indefiniteness and for adding a numerical limitation to the specified characteristic or descriptor. As understood by a skilled artisan, the practical deviation of the exact value or characteristic of such value, element, or property from that stated falls and may vary within a numerical range defined by an experimental measurement error that is typical when using a measurement method accepted in the art for such purposes.

The use of these terms in describing a chosen characteristic or concept neither implies nor provides any basis for indefiniteness and for adding a numerical limitation to the specified characteristic or descriptor. As understood by a skilled artisan, the practical deviation of the exact value or characteristic of such value, element, or property from that stated falls and may vary within a numerical range defined by an experimental measurement error that is typical when using a measurement method accepted in the art for such purposes. The term "A and/or B" or a similar term means "A alone, B alone, or A and B together" and is defined to be interchangeable with the term "at least one of A and B."

While the invention is described through the above-described exemplary embodiments, it will be understood by those of ordinary skill in the art that modifications to, and variations of, the illustrated embodiments may be made without departing from the inventive concepts disclosed herein. Disclosed aspects, or portions of these aspects, may be combined in ways not listed above. Accordingly, the invention should not be viewed as being limited to the disclosed embodiment(s).

The invention claimed is:

1. An article of manufacture having an axis and comprising:
   an optical fiber component that contains a sequence of immediately-neighboring one another multiple dielectric boundaries defined across the axis;
   a substantially cylindrical body of glass having an output facet; and
   an intermediate body of glass material seamlessly connected with the optical fiber component at a first end thereof and seamlessly connected with the substantially cylindrical body of glass at a second end thereof,
   wherein the article is configured to propagate an optical mode of the optical fiber component through both the intermediate body and the substantially cylindrical body only in one direction, and
   wherein the optical fiber component includes two first optical fiber elements each having a first glass content and each carrying multiple dielectric boundaries defined across the axis, and a second optical fiber element between said two first optical fiber elements, a glass content of the second optical fiber element being necessarily different from the first glass content.

2. An article of manufacture according to claim 1,
   (19A) wherein said optical fiber component includes a first optical fiber element, of the tow first optical fiber elements, that has a first glass content and carrying said multiple dielectric boundaries and the second optical fiber element made of substantially the same glass material as that of the intermediate body; and/or (19B) wherein an outer surface of the intermediate body is connected with an outer surface of the substantially cylindrical body in a tangentially parallel manner; and/or (19C) wherein a diameter of the intermediate body is different from both a diameter of the optical fiber component and a diameter of the substantially cylindrical body.

3. An article of manufacture according to claim 1, wherein the intermediate body is configured to have a first diameter thereof at the first end to be smaller than a second diameter thereof at the second end while, at the same time, to define a first angle of divergence of an optical mode of the optical fiber component propagating therethrough at the first end to be larger than a second angle of divergence of said optical mode at the second end.

4. An article of manufacture according to claim 1, wherein:

(21A) a combination of the intermediate body and the substantially cylindrical body is configured such as to define a propagation of an optical mode of the optical fiber component between the first end and the output facet to be without a reflection returned to the optical fiber component; and/or (21B) the substantially cylindrical body of glass is dimensioned such as to define a spatial expansion of the optical mode of the optical fiber component, that has reached the substantially cylindrical body of glass through the intermediate body, at a substantially constant rate while propagating therethrough; and/or (21C) the intermediate body is dimensioned such as to change an angle of divergence of the optical mode of the optical fiber component, propagating therethrough from the optical fiber component to the substantially cylindrical body, at least once.

5. An article of manufacture according to claim 1, wherein the intermediate body includes a sequence of multiple coaxially positioned truncated cones of glass material spatially coordinated with one another such that a top of a first truncated cone forms a part of a base of a second truncated cone.

6. An article of manufacture according to claim 1, wherein a combination of the two first optical fiber elements and the second optical fiber element is configured to increase an irradiance light, generated in said second optical fiber element of the optical fiber component when an auxiliary light is delivered thereto.

7. An article of manufacture according to claim 1, wherein the optical fiber component has a fiber core and a fiber cladding, and
wherein said substantially cylindrical body has a termination core, and a termination cladding.

8. An article of manufacture according to claim 7, wherein a first ratio of the termination core diameter to the termination cladding diameter is substantially equal to a second ratio of the fiber core diameter to the fiber cladding diameter.

9. An article of manufacture according to claim 7, wherein the substantially cylindrical body is dimensioned such that an optical mode of the optical fiber component propagating therethrough is not totally internally reflected at a boundary between the termination core and the termination cladding.

10. An article of manufacture according to claim 1,
(28A) wherein the output facet is configured to change a degree of divergence or convergence of light propagating therethrough; and/or
(28B) wherein the article further comprises an auxiliary optical element affixed to the output facet, wherein the auxiliary optical element has a non-uniform radial distribution of a refractive index and/or is dimensioned to change a degree of divergence or convergence of light propagating therethrough.

11. A method comprising:
using the article of manufacture according to claim 1:
partially transmitting first light completely within a first glass medium through at least two of said multiple dielectric boundaries in a first region of said first glass medium to form operationally useful light,
wherein each of the at least of said multiple dielectric boundaries in the first region separates areas of said first glass medium that have different refractive indices;
and
propagating the operationally useful light only in one direction through the substantially cylindrical body of glass material while necessarily expanding a size of spatial distribution of said operationally useful light upon so propagating to define an output light at the output facet.

12. A method according to claim 11, further comprising channeling the operationally useful light from the at least two of said multiple dielectric boundaries to the substantially cylindrical portion completely within a second glass medium while maintaining said size substantially constant during said channeling.

13. A method according to claim 11, wherein said propagating does not include totally internally reflecting said operationally useful light at a dielectric boundary.

14. A method according to claim 11, further comprising multiply circulating the first light between the at least two of said multiple dielectric boundaries in the first region and at least two immediately-neighboring dielectric boundaries in a second region of said first glass medium,
wherein each of the at least two immediately-neighboring dielectric boundaries in the second region separates areas of said first glass medium that have different refractive indices.

15. A method according to claim 14, wherein said multiply circulating includes multiply circulating the first light within an auxiliary glass medium while coupling second light into the auxiliary glass medium.

16. A method according to claim 11, wherein said propagating the operationally useful light includes passing the operationally useful light from the optical fiber component to the substantially cylindrical portion completely within bounds of a glass material.

17. A method according to claim 11, further comprising: conveying said operationally useful light only in one direction through a section of glass material with an outer diameter different from both an outer diameter of the optical fiber component and an outer diameter of the substantially cylindrical portion.

18. A method according to claim 17,
(36A) wherein said propagating includes delivering said operationally useful light from a chosen location to said output facet un-interruptingly through a glass material dimensioned to have an outer surface that is necessarily differentiable, and/or
- (36B) wherein said propagating includes delivering said operationally useful light from the chosen location to said output facet un-interruptingly through a glass material dimensioned to have an outer surface that includes a sequence of conical surfaces, wherein a first conical surface at an entrance of the substantially cylindrical portion has a first apex angle and a second conical surface separated from the substantially cylindrical portion by the first conical surface has a second apex angle, the second apex angle being larger than the first apex angle;

and/or
- (36C) wherein said propagating includes delivering said operationally useful light from the chosen location to the output facet through a sequence of multiple coaxially positioned truncated cones of glass material spatially coordinated such that a top of one truncated cone forms a part of a base of another truncated cone.

19. An article of manufacture having an axis and comprising:
- an optical fiber component that contains a sequence of immediately-neighboring one another multiple dielectric boundaries defined across the axis;
- a substantially cylindrical body of glass having an output facet; and
- an intermediate body of glass material seamlessly connected with the optical fiber component at a first end thereof and seamlessly connected with the substantially cylindrical body of glass at a second end thereof,
- wherein the intermediate body includes a sequence of multiple coaxially positioned truncated cones of glass material spatially coordinated with one another such that a top of a first truncated cone forms a part of a base of a second truncated cone, and
- wherein the article is configured to propagate light of an optical mode of the optical fiber component through both the intermediate body and the substantially cylindrical body only in one direction.

20. An article of manufacture according to claim 19,
- (39A) wherein said optical fiber component includes a first optical fiber element having a first glass content and carrying said multiple dielectric boundaries and a second optical fiber element made of substantially the same glass material as that of the intermediate tapered body;

and/or
- (39B) wherein an outer surface of the intermediate body is connected with an outer surface of the substantially cylindrical body in a tangentially parallel manner;

and/or
- (39C) wherein a diameter of the intermediate body is different from both a diameter of the optical fiber component and a diameter of the substantially cylindrical body.

21. An article of manufacture according to claim 19, wherein:
- (40A) a combination of the intermediate body and the substantially cylindrical body is configured such as to define a propagation of an optical mode of the optical fiber component between the first end and the output facet to be without a reflection of light returned to the optical fiber component; and/or
- (40B) the substantially cylindrical body of glass is dimensioned such as to define a spatial expansion of the optical mode of the optical fiber component, that has reached the substantially cylindrical body of glass through the intermediate body, at a substantially constant rate while propagating therethrough; and/or
- (40C) the intermediate body is dimensioned such as to change an angle of divergence of the optical mode of the optical fiber component, propagating therethrough from the optical fiber component to the substantially cylindrical body, at least once.

22. An article of manufacture according to claim 19, wherein the optical fiber component includes two first optical fiber elements each having a first glass content and each carrying multiple dielectric boundaries defined across the axis, and a second optical fiber element between said two first optical fiber elements, a glass content of the second optical fiber element being necessarily different from the first glass content.

23. An article of manufacture according to claim 22, wherein a combination of the two first optical fiber elements and the second optical fiber element is configured to increase an irradiance light generated in said second optical fiber element when an auxiliary light is delivered thereto.

24. An article of manufacture according to claim 19,
- (43A) wherein the output facet is configured to change a degree of divergence or convergence of light propagating therethrough; and/or
- (43B) wherein the article further comprises an auxiliary optical element affixed to the output facet, wherein the auxiliary optical element has a non-uniform radial distribution of a refractive index and/or is dimensioned to change a degree of divergence or convergence of light propagating therethrough.

* * * * *

UNITED STATES PATENT AND TRADEMARK OFFICE
CERTIFICATE OF CORRECTION

PATENT NO. : 12,068,573 B2
APPLICATION NO. : 17/994517
DATED : August 20, 2024
INVENTOR(S) : Stephen E. Griffin It is certified that error appears in the above-identified patent and that said Letters Patent is hereby corrected as shown below:

In the Claims

Claim 2, Column 20, Line 66, "(19A)" should be --(2A)--.

Claim 2, Column 20, Line 67, "tow" should be --two--.

Claim 2, Column 21, Line 6, "(19B)" should be --(2B)--.

Claim 2, Column 21, Line 10, "(19C)" should be --(2C)--.

Claim 4, Column 21, Line 25, "(21A)" should be --(4A)--.

Claim 4, Column 21, Line 31, "(21B)" should be --(4B)--.

Claim 4, Column 21, Line 37, "(21C)" should be --(4C)--.

Claim 10, Column 22, Line 2, "(28A)" should be --(10A)--.

Claim 10, Column 22, Line 5, "(28B)" should be --(10B)--.

Claim 18, Column 22, Line 63, "(36A)" should be --(18B)--.

Claim 18, Column 23, Line 2, "(36B)" should be --(18B)--.

Claim 18, Column 23, Line 42, "(36C)" should be --(18C)--.

Claim 20, Column 23, Line 41, "(39A)" should be --(20A)--.

Claim 20, Column 23, Line 48, "(39B)" should be --(20B)--.

Signed and Sealed this
First Day of October, 2024

*Katherine Kelly Vidal*
Katherine Kelly Vidal
*Director of the United States Patent and Trademark Office*

CERTIFICATE OF CORRECTION (continued)
U.S. Pat. No. 12,068,573 B2

Claim 20, Column 24, Line 2, "(39C)" should be --(20C)--.

Claim 21, Column 24, Line 8, "(40A)" should be --(21A)--.

Claim 21, Column 24, Line 14, "(40B)" should be --(21B)--.

Claim 21, Column 24, Line 20, "(40C)" should be --(21C)--.

Claim 24, Column 24, Line 41, "(43A)" should be --(24A)--.

Claim 24, Column 24, Line 44, "(43B)" should be --(24B)--.